US005489966A

United States Patent [19]
Kawashima et al.

[11] Patent Number: 5,489,966
[45] Date of Patent: Feb. 6, 1996

[54] PROJECTION EXPOSURE APPARATUS

[75] Inventors: Haruna Kawashima, Kawasaki; Akiyoshi Suzuki, Tokyo; Masato Muraki, Yokohama, all of Japan

[73] Assignee: Canon Kabushiki Kaisha, Tokyo, Japan

[21] Appl. No.: 281,663

[22] Filed: Jul. 28, 1994

Related U.S. Application Data

[63] Continuation of Ser. No. 46,372, Apr. 13, 1993, abandoned, which is a continuation of Ser. No. 945,441, Sep. 14, 1992, abandoned, which is a continuation of Ser. No. 840,141, Feb. 24, 1992, abandoned, which is a continuation of Ser. No. 700,060, May 8, 1991, Pat. No. 5,117,254, which is a continuation of Ser. No. 607,640, Oct. 31, 1990, abandoned, which is a continuation of Ser. No. 350,859, May 12, 1989, abandoned.

[30] Foreign Application Priority Data

May 13, 1988 [JP] Japan ................................ 63-116445
Oct. 14, 1988 [JP] Japan ................................ 63-258555

[51] Int. Cl.⁶ .......................... G03B 27/52; G03B 27/70; G03B 27/42
[52] U.S. Cl. .................. 355/43; 355/53; 355/55
[58] Field of Search .................... 355/53, 68; 250/548, 250/201.2, 204; 354/402–404, 408; 356/400

[56] References Cited

U.S. PATENT DOCUMENTS

| | | | |
|---|---|---|---|
| 4,395,117 | 7/1983 | Suzuki | 355/43 |
| 4,506,977 | 3/1985 | Sato et al. | 355/53 |
| 4,629,313 | 12/1986 | Tanimoto | 355/53 |
| 4,650,983 | 3/1987 | Suwa | 250/204 |
| 4,668,077 | 5/1987 | Tanaka | 355/53 X |
| 4,705,940 | 11/1987 | Kohno | 250/201 |
| 4,780,747 | 10/1988 | Suzuki et al. | 355/68 |
| 4,801,977 | 1/1989 | Ishizaka et al. | 355/53 X |
| 4,814,829 | 3/1989 | Kosugi et al. | 355/43 |
| 4,874,954 | 10/1989 | Takahashi et al. | 250/548 |
| 4,875,076 | 10/1989 | Torigoe et al. | 355/53 |
| 4,952,970 | 8/1990 | Suzuki et al. | 355/43 |
| 4,958,082 | 9/1990 | Makinouchi et al. | 355/43 X |
| 5,101,226 | 3/1992 | Beaulieu et al. | 355/53 |
| 5,114,223 | 5/1992 | Torigoe et al. | 355/53 X |
| 5,117,254 | 5/1992 | Kawashima et al. | 355/43 |
| 5,117,255 | 5/1992 | Shiraishi et al. | 355/53 |
| 5,148,214 | 9/1992 | Ohta et al. | 355/43 X |
| 5,150,173 | 9/1992 | Isobe et al. | 356/401 X |
| 5,160,957 | 11/1992 | Ina et al. | 355/43 X |
| 5,160,962 | 11/1992 | Miura et al. | 355/53 |

FOREIGN PATENT DOCUMENTS 62-016526  1/1987  Japan.

OTHER PUBLICATIONS

Mende/Simon, "Physik: Gleichungen und Tabellen," Munich, 1977, pp. 324 and 325.

Primary Examiner—Richard A. Wintercorn
Attorney, Agent, or Firm—Fitzpatrick, Cella, Harper & Scinto

[57] ABSTRACT

A projection exposure apparatus including a mask stage for supporting a mask, a wafer stage for supporting a wafer, and a projection optical system for projecting, on the wafer, an image of a circuit pattern of the mask, is disclosed. There are provided a surface position detecting system for detecting position of a surface of the wafer with respect to a direction of an optical axis of the projection optical system, an adjusting device for adjusting an interval between the wafer and the projection optical system, to position the wafer surface at a focus position of the projection optical system, and an outputting portion operable to direct a light beam to a reflection surface, provided at a predetermined site on the wafer stage, and to receive reflection light coming from the reflection surface through the projection optical system, the outputting portion producing a signal corresponding to a positional relationship between the reflection surface and the focus position of the projection optical system. A focus position detecting system detects the focus position of the projection optical system, on the basis of the signal from the outputting portion, and a control system controls the adjusting device on the basis of an output of the focus position detecting system and an output of the surface position detecting system.

13 Claims, 13 Drawing Sheets

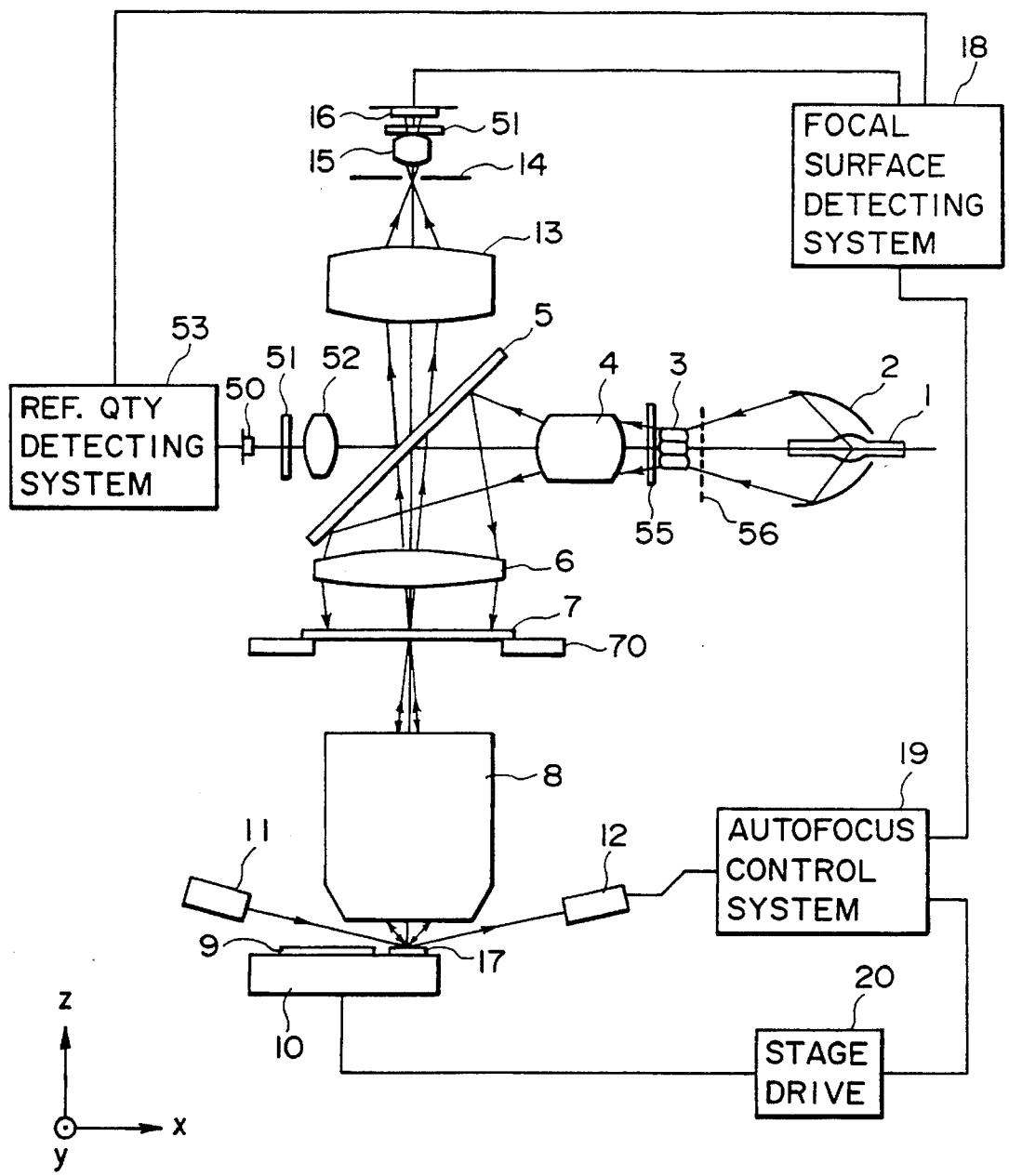
F I G. 1

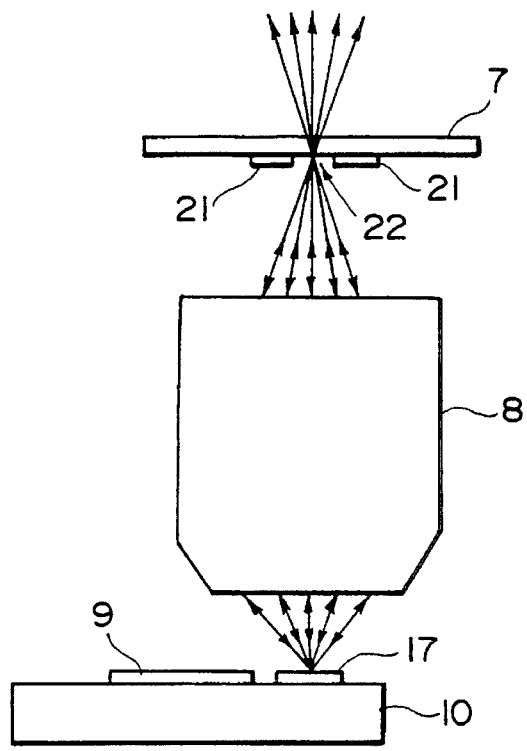
F I G. 2
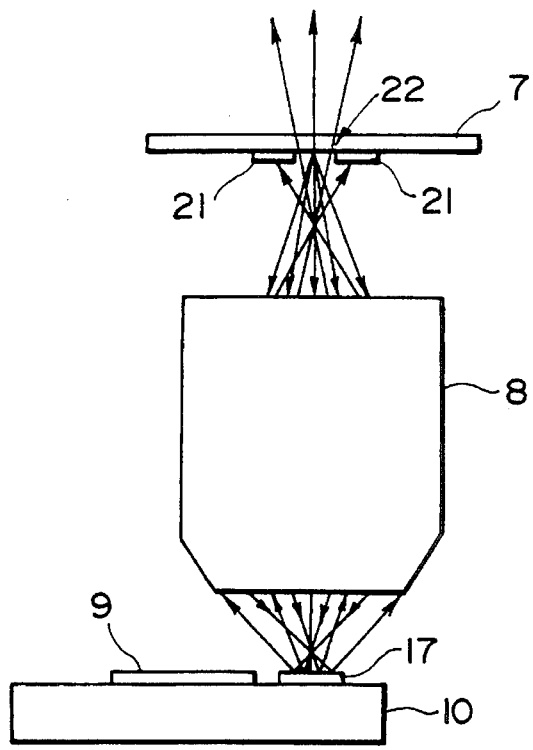
F I G. 3

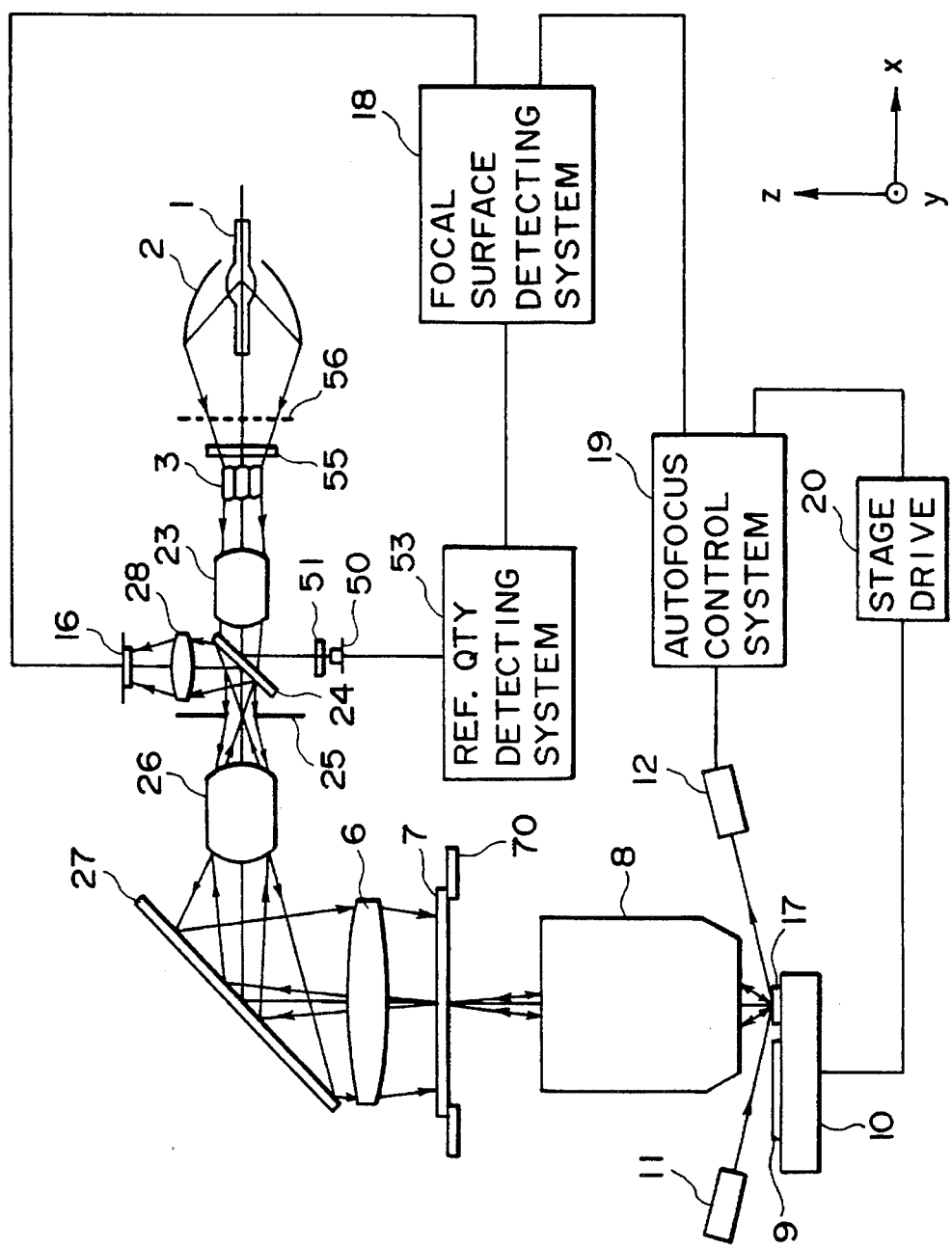
F I G. 7

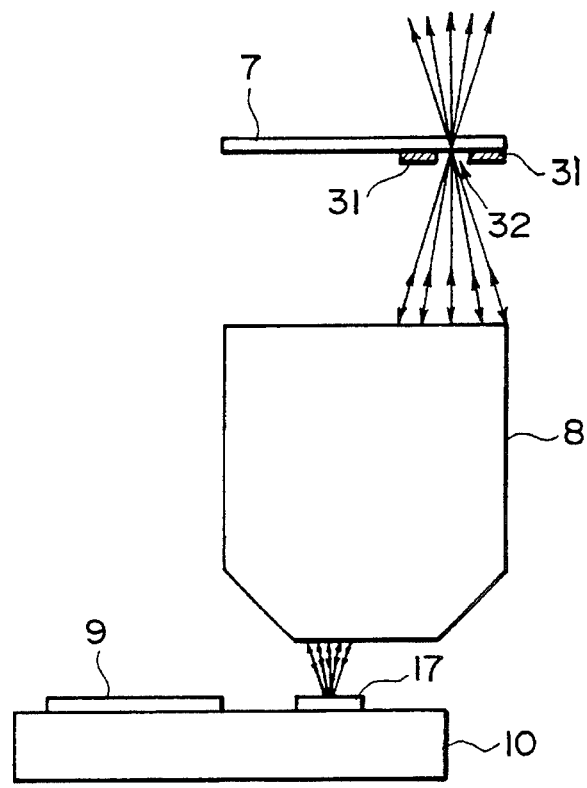
F I G. 9A
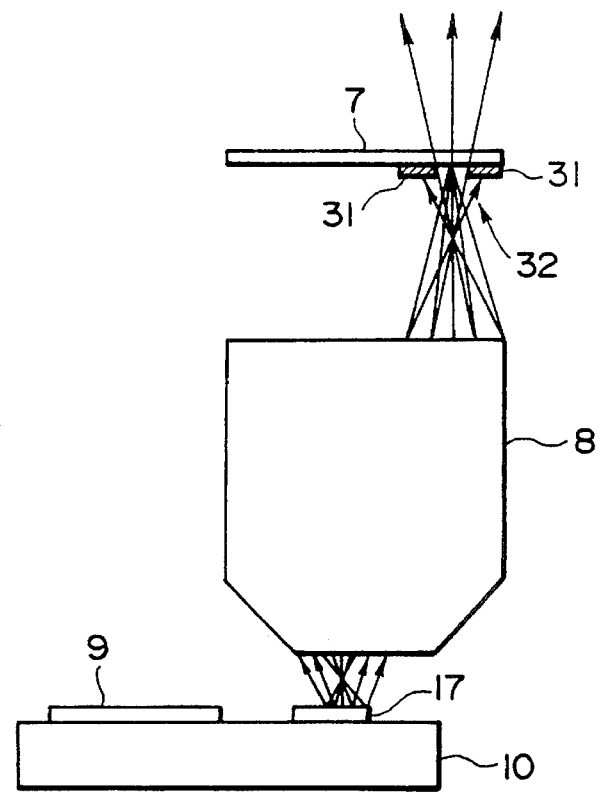
F I G. 9B

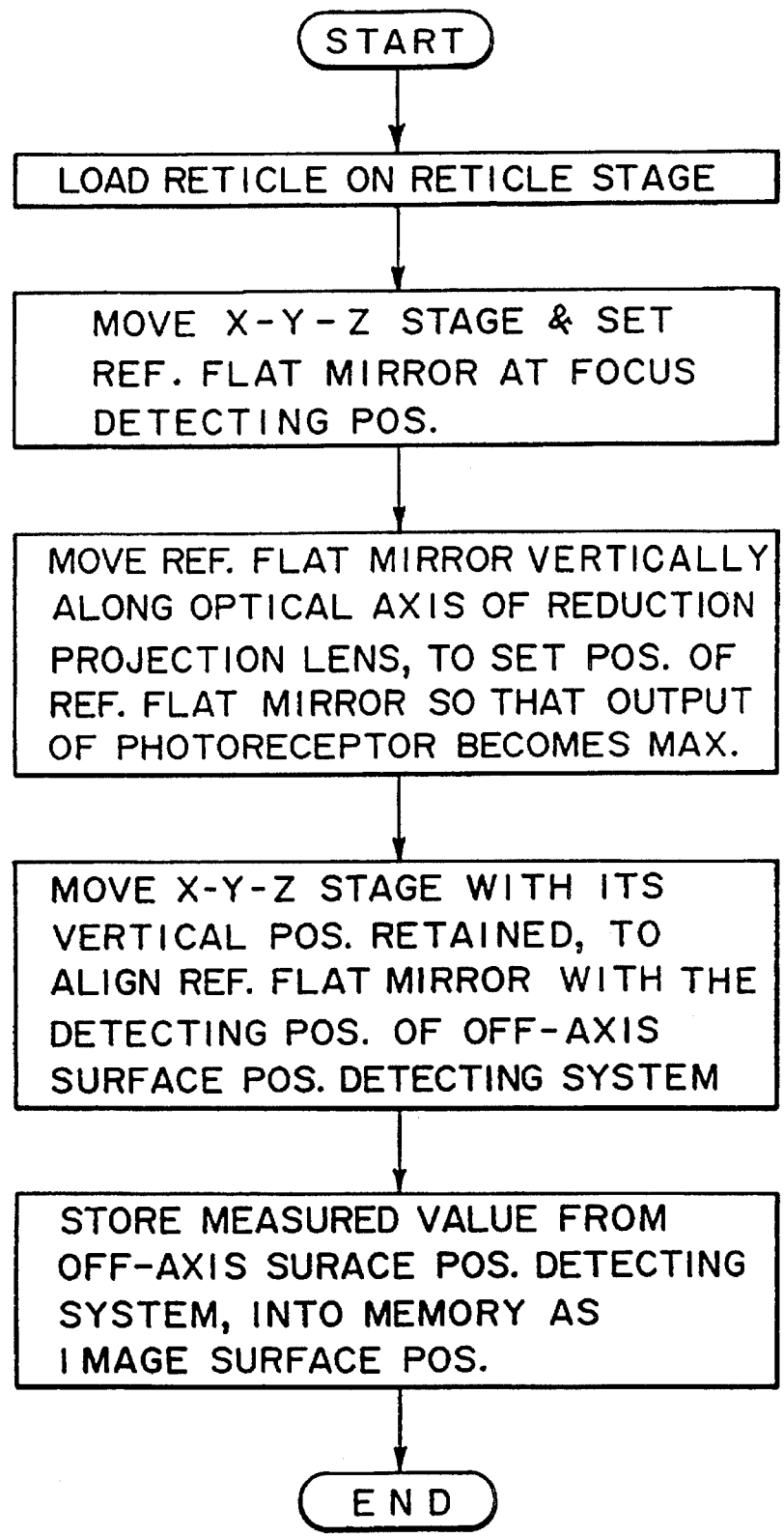
F I G. 15

PROJECTION EXPOSURE APPARATUS

This application is a continuation of prior application Ser. No. 08/046,372 filed Apr. 13, 1993, which application is a continuation of prior application Ser. No. 07/945,441 filed Sep. 14, 1992, which application is a continuation of prior application Ser. No. 07/840,141 filed Feb. 24, 1992, all now abandoned, which application is a continuation of prior application Ser. No. 07/700,060, filed May 8, 1991 now U.S. Pat. No. 5,117,254, which application is a continuation of prior application Ser. No. 07/607,640 filed Oct. 31, 1990, which application is a continuation of prior application Ser. No. 07/350,859 filed May 12, 1989, both now abandoned.

FIELD OF THE INVENTION AND RELATED ART

This invention relates to a projection exposure apparatus and, more particularly, to a projection exposure apparatus having a function for detecting a focus position of a projection optical system used therein.

Recent requirements of further miniaturization and higher density of integration of patterns for semiconductor microcircuit devices such as LSIs, super LSIs and the like have forced development of a projection exposure apparatus including a projection optical system having a higher resolution. This leads to enlargement of the numerical aperture (NA) of a projection optical system, which naturally results in reduced depth of focus of the projection optical system.

In a different aspect, on the point of surface machining techniques, it will have to be admitted that a semiconductor wafer has a variation in its thickness and a surface curvature (non-flatness). Usually, for correction of the curvature of a wafer, the wafer is placed on a wafer chuck having been machined so as to ensure a flatness of a submicron order, the flatness correction being made by attracting the backside surface of the wafer through vacuum attraction. However, even with such flatness correction, it is not possible to correct deformation of the wafer which results from variation in thickness of the wafer itself or from the vacuum attraction process or, alternatively, with the progress of the wafer process.

As a consequence, within a small range of a picture field in which a reticle pattern is to be projected in a reduced scale by projection exposure, a wafer has a surface irregularity, which leads to further reduction in the effective depth of focus of the optical system.

In consideration of the above, it is an important theme in a reduction projection exposure apparatus to develop an autofocusing method effective to automatically bring a wafer surface into coincidence with the focus position (image surface) of a projection optical system.

For such autofocusing, first the focus position of a projection optical system should be detected accurately and, second, the position of the surface of a wafer should be detected accurately. Regarding detection of the wafer surface position, satisfactory results will be obtainable by using an air-sensor means or an optical focus detecting system. However, with regard to detection of the focus position of a projection optical system, some problems still remain.

As an example, in this type of projection exposure apparatus, the focus position (image surface position) of a projection optical system is variable due to a change in ambient temperature of the projection optical system, a change in ambient atmospheric pressure, an increase in temperature of the optical system resulting from irradiation thereof with light or an increase in temperature of the optical system resulting from heat generation within the exposure apparatus. In consideration of this, there has been used a detecting means for measuring any change in the ambient temperature or pressure or for measuring any change in temperature or pressure at a part inside the projection optical system, on the basis of which measurement any change in the focus position of the projection optical system can be calculated and adjustment may be made to shift the focus position to a predetermined site or to displace the wafer surface to the changed focus position.

With this method, however, the focus position of a projection optical system cannot be measured directly. Therefore, it is not possible to preclude an error in measurement by the detecting means, detecting the temperature or pressure, or an error which is included in calculation, based on approximation, used for calculating the focus position of the projection optical system in accordance with an output of such detecting means. As a consequence, with this method, it is very difficult to detect the focus position of a projection optical system accurately.

SUMMARY OF THE INVENTION

It is accordingly a primary object of the present invention to provide a projection exposure apparatus having a function for accurately detecting the focus position of a projection optical system used therein.

This object can be achieved in several preferred embodiments of a projection exposure apparatus according to the present invention. In one preferred form, which will be described later in detail, the projection exposure apparatus includes a projection system, a reflection means provided at a plane defined by projection by the projection system, an illumination means for illuminating a pattern with a radiation beam so that an image of the pattern is directed through the projection system to the reflection means, and an outputting means for receiving any of the beams reflected by the reflection means and passing by way of the projection system, to produce a signal corresponding to a positional relationship between the reflection means and a focus position of the projection system, wherein the pattern is so structured to have a linewidth l which, where NA denotes the numerical aperture of the projection system, $\beta$ denotes the magnification of projection and $\lambda$ denotes the wavelength of the radiation beam, satisfies the following equation:

$$0.6(\lambda/NA\cdot\beta)\leq l\leq 1.0(\lambda/NA\cdot\beta).$$

Preferably, the linewidth l of the pattern is so determined to satisfy the following relation:

$$0.6(\lambda/NA\cdot\beta)\leq l\leq 0.8(\lambda/NA\cdot\beta).$$

In another preferred form of the invention, the projection exposure apparatus includes a projection system, a reflection means provided at a plane defined by projection through the projection system, an illumination means for illuminating a pattern with a radiation beam so that an image of the pattern is directed through the projection system to the reflection means, an outputting means for receiving any of the beams reflected by the reflection means and passing by way of the projection system to produce a signal corresponding to a positional relationship between the reflection means and a focus position of the projection system, and a beam intensity detecting means for producing a signal corresponding to the intensity of the radiation beam, wherein on the basis of the signals from the outputting means and the detecting means, the focus position of the projection system can be detected.

In yet another preferred form of the invention, the projection exposure apparatus includes a projection system, a reflection means provided at a plane defined by projection through the projection system, an illumination means for illuminating a circuit pattern of a mask with a radiation beam so that an image of the circuit pattern is directed through the projection system to the reflection means, an outputting means for receiving any of the beams reflected by the reflection means and passing from the projection system, to produce a signal corresponding to a positional relationship between the reflection means and a focus position of the projection system and, additionally, a mechanism for selectively illuminating different portions of the mask by cooperation with the illumination means.

In a still further preferred form of the invention, the projection exposure apparatus includes a projection system, a reflection means provided at a plane defined by projection through the projection system, an illumination system for illuminating a pattern with a radiation beam so that an image of the pattern is directed through the projection system to the reflection means, an outputting means for receiving any of the beams reflected by the reflection means to produce a signal corresponding to a positional relationship between the reflection means and a focus position of the projection system, and a storing means for storing therein data related to the curvature of field of the projection system, wherein the focus position of the projection system can be detected on the basis of the signal from the outputting means and the data stored in the storing means.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIG. 1 is a schematic and diagrammatic view of a projection exposure apparatus according to a first embodiment of the present invention.

FIGS. 2 and 3 are representations for explaining the principle of detecting a focus position in the first embodiment.

FIG. 7 is a partially schematic and diagrammatic view of a projection exposure apparatus according to a second embodiment of the present invention.

FIGS. 9A and 9B are schematic representations, for explaining the principle of detecting a focus position, in the third embodiment.

FIG. 15 is a flow chart showing the sequence of an autofocusing operation to be made to a wafer, in accordance with a different aspect of the present invention.

DESCRIPTION OF THE PREFERRED EMBODIMENTS

Figure 5:
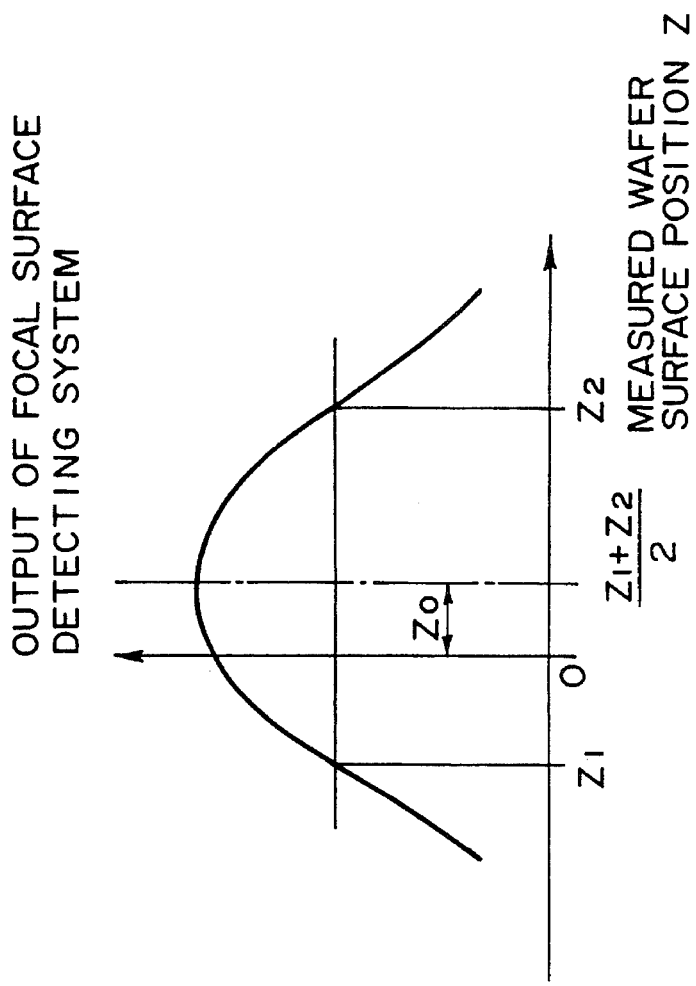
FIG. 5 is a graph showing an output signal from a focal surface detecting system used in the first embodiment.

Preferred embodiments of the present invention, which will be described later, are constructed on the basis of the following four basic concepts. Also, the measurement of the position of an image surface of a projection system, namely, the focus position, is made by what can be called a "TTL (through-the-lens) process" wherein the projection system itself is used.

(1) The focus position (image surface of a projection system) is detected by using a radiation beam having the same wavelength as an exposure (photoprinting or sensitizing) wavelength.

(2) The focus position is detected by using a reticle prepared for use in circuit pattern printing.

(3) An off-axis wafer surface position detecting system, not relying on a projection system, is used for detection of the wafer surface position.

(4) For the detection of the focus position, a reference reflection surface not coated with a resist material or otherwise is provided on a wafer stage.

As an example, use of light of a wavelength the same as or substantially the same as that of light actually used for the exposure (photoprinting) as well as a reticle having a circuit pattern formed thereon, for detection of focus, will be the best. If the wavelength of the focus detecting light differs from that of the exposure (photoprinting) light, the pressure versus focus characteristics of the projection optical system (lens system) or the optical energy absorption versus focus characteristic, for example, changes slightly and, therefore, it is necessary to correct or compensate the change as an "offset" by calculation. Such correction is a factor for a detection error. Further, it is not possible to characterize all the phenomena only by calculation. Here, if a wafer coated with a resist is used directly and if the focus position detecting light has a wavelength substantially the same as that of the exposure (photoprinting) light, there are two problems. One is that the photoprinting wavelength sensitizes the resist. The other is that, if a process such as a multilayered resist or an absorptive resist is used at the wafer side, a sufficient amount of reflection light does not come back from the wafer. These problems can be solved in the present invention, by not using a wafer coated with a resist, but by providing a reference reflection surface on a wafer stage. The position of such a reference reflection surface can be measured both by using an off-axis type surface position detecting device and by using a TTL type focus position detecting system, in accordance with the present invention.

Based on this, the focus position of a projection optical system can be detected exactly.

Further, since the off-axis surface position detecting system may use a non-sensitizing wavelength, the measurement can be free from the problem peculiar to the multilayered resist and the like.

A representative example, of a TTL type focus position detecting method is such that an image of a slit is projected through a projection lens on a wafer surface and reflection light from the wafer surface is received through the projection lens and the slit and, from the level of the quantity of the received light, the best focus position is determined. As a known example, such a slit is provided within an observation microscope and is projected as described, and by using a photodetector, the quantity of received light is detected.

As for the imaging using such a projection lens, the highest precision imaging can be done with regard to the imaging between a reticle (photomask) and a wafer by using an exposure wavelength. If something, other than a reticle, such as a slit is used, which slit may be provided within a microscope, as described, there occurs an error. Since a reticle has formed thereon a fine pattern for manufacture of LSIs or otherwise, by using such a fine pattern of the reticle itself, it is possible to obtain a focus error signal, without providing a specific focus error detecting slit in the microscope system. Further, for continuously stable detection of the focus position, it is preferable that different reticles are provided with respective focus position detecting slits of the same configuration. In consideration of this, a focusing mark may preferably be provided at a portion of each reticle, other than a circuit pattern region thereof.

In one preferred form of the projection exposure apparatus, after a reticle (mask) having a circuit pattern is mounted to a stage, light having the same wavelength as that of the exposure light is supplied from an illumination means to a focusing mark provided on the reticle, and the light passing the reticle is directed to a projection optical system to a reference reflection surface provided on a wafer stage. Then, reflected light from the reference reflection surface is received through the projection optical system and the reticle by a photoreceptor. An output signal from this photoreceptor provides a focus error signal. The wafer stage may be displaced upwardly or downwardly in a direction of an optical axis of the projection optical system to change the position of the reference reflection surface and, by detecting such position of the reference reflection surface at which the output signal from the photoreceptor becomes maximum, the detected position can be discriminated as being the best focus position (optimum image surface position) of the projection optical system. On the other hand, by monitoring the position of this reference reflection surface by using a separately provided off-axis type wafer surface position detecting device, it is possible to execute automatic focus control to the wafer surface, following any change with time of the focus position of the projection optical system, that is, what can be called an "autofocusing" is attainable. In other words, the best focus position of the projection optical system having been detected by using a TTL type focus position detecting system, may be used as a reference position for an off-axis type surface position detecting device and, when the focusing is actually to be made to a wafer, the off-axis type surface position detecting device may be used to detect any error in the wafer surface position with respect to this reference position (or any error in each shot area on the wafer) and the detected error may be corrected.

Preferred embodiments of the present invention will now be described.

FIG. 1 is a schematic representation showing a major portion of a reduction projection exposure apparatus having an automatic focus control device, according to one embodiment of the present invention.

Denoted in FIG. 1 at 7 is a reticle which is held by a reticle stage 70. A circuit pattern formed on the reticle 7 is imaged, through a reduction projection lens 8 in a reduced scale of $\frac{1}{5}$, on a wafer 9 placed on an X-Y-Z stage 10, whereby exposure of the wafer 9 is conducted. In FIG. 1, disposed adjacent to the wafer 9 placed on the X-Y-Z stage 10 is a reference flat mirror 17 having a mirror surface whose height is substantially the same as that of the upper surface of the wafer 9. The reason for using such a reference flat mirror 17 in place of an actual wafer coated with a resist, is such as described hereinbefore.

The X-Y-Z stage 10 is movable in a direction (Z-axis direction) of an optical axis of the projection lens system 8 as well as in a plane (X-Y plane) perpendicular to that direction. Of course, it may be made rotatable about the optical axis. The picture field of the reticle 7 in which the circuit pattern is formed can be illuminated by means of an illumination optical system comprising those elements denoted at 1 through 6 in FIG. 1.

Hg lamp 1, which is a light source for exposure, has a light emitting portion that is positioned at a first focal point of an elliptical mirror 2, and light emanating from the Hg lamp 1 is concentrated at a second focal point position of the elliptical mirror 2. Optical integrator 3 is so disposed that its light receiving surface is positioned at the second focal point position of the elliptical mirror 2. Thus, the light emitting surface of the optical integrator 3 defines a secondary light source. The light emanating from the optical integrator 3 providing such a secondary light source passes through a condenser lens 4 and, then, by means of a mirror 5, the optical axis (optical path) is deflected at a right angle. Denoted at 55 is a filter for selectively extracting light of an exposing (sensitizing) wavelength; and at 56 is a shutter for controlling the exposure. The exposing light reflected by this mirror 5 goes through a field lens 6 and irradiates the picture region on the reticle 7, through which the transfer of the circuit pattern is to be executed. In this embodiment, the mirror 5 is so structured that it can partially transmit the exposing light such as, for example, of an amount of 5–10%. The light passing through the mirror 5 is directed by way of a lens 52 and a filter 51, effective to transmit only light of the sensitizing wavelength, but to intercept such component of light unwanted for the photoelectric detection, and a resultant light reaches a photodetector 50 adapted to monitor variation in intensity of the exposing light resulting from any fluctuation in the light source, for example.

The elements denoted at 11 and 12 in FIG. 1 provide an off-axis surface position detecting optical system. More particularly, denoted at 11 is a light projecting optical system, the light emanating from the light projecting optical system 11 and consisting of a non-exposing (non-sensitizing) light being concentrated upon a point on the reference flat mirror 17 (or a point on the upper surface of the wafer 9) which intersects with the optical axis of the reduction projection lens system 8, and then it is reflected thereat. The light reflected by this reference flat mirror 17 enters a detection optical system 12. While not shown in the drawing, a position detecting photoreceptor is provided within the detection optical system 12, and the detection optical system 12 is disposed so that its position detecting photoreceptor is placed in an optically conjugate relationship with the light reflection point on the reference flat mirror 17. Any positional deviation of the reference flat mirror 17 in the direction of the optical axis of the reduction projection lens system 8 can be measured as a positional deviation of an incident light upon the position detecting photoreceptor in the detection optical system 12.

A signal indicative of the positional deviation of the reference flat mirror 17 with respect to a predetermined reference plane, as measured by the detection optical system 12, is transmitted to an autofocus control system 19. In response, the autofocus control system 19 supplies an instruction to a driving system 20 to move the X-Y-Z stage 10 to which the reference flat mirror 17 is fixed. Also, for detection of the focus position through the TTL detection system, the autofocus control system 19 operates to move the reference mirror 17 upwardly or downwardly in the direction (Z direction) of the optical axis of the projection lens system 8 and in a portion adjacent to the position of the predetermined reference plane. Further, the position control for the wafer 9 at the time of exposure thereof (on this occasion, a predetermined portion of the wafer 9 to be exposed is placed at the position of the reference flat mirror 17 as shown in FIG. 1) is conducted under the influence of the autofocus control system 19.

Next, description will be made of a focus position detecting optical system for detecting the focus position of the reduction projection lens system 8, according to the present invention.

Referring to FIGS. 2 and 3, denoted at 7 is a reticle; at 21—21 are pattern portions each being formed on the reticle 7 and each having a light blocking property; and at 22 is a light transmitting portion sandwiched by adjacent pattern portions 21. For detection of the focus position (image surface position) of the reduction projection lens system 8, the X-Y-Z stage 10 is displaced along the optical axis of the reduction projection lens system 8.

The reference flat mirror 17 is so positioned on this occasion to intersect the optical axis of the reduction projection lens system 8, and also, on this occasion, the reticle 7 is being illuminated by the illumination optical system comprising elements 1 through 6.

First, explanation will be made in conjunction with FIG. 2 of a case wherein the reference flat mirror 17 is exactly in the focal surface of the reduction projection lens system 8. Sensitizing light, passing through the light transmitting portion 22 of the reticle 7, is focused through the reduction projection lens system 8 upon the reference flat mirror 17, whereby an image of the pattern comprising the portions 21 and 22 is formed thereon. The light incident on the mirror 17 is reflected thereby. The reflected sensitizing light goes back along its oncoming path and, through the reduction projection lens system 8, it is focused upon the reticle 7 and passes the light transmitting portion 22 between the pattern portions 21 of the reticle 7. At this time, the sensitizing light is not eclipsed by the pattern portions 21 of the reticle 7, and all the reflected light can pass through the light transmitting portion of the pattern 21.

Next, explanation will be made in conjunction with FIG. 3 of a case wherein the reference flat mirror 17 is at a position shifted downwardly from the focal surface of the reduction projection lens system 8. The sensitizing light passing the light transmitting portion of the pattern 21 of the reticle 7 goes through the reduction projection lens system 8 and reaches the reference flat mirror 17. Since, however, the reference flat mirror 17 is out of the focal surface of the reduction projection lens system 8, the image of the pattern comprising portions 21 and 22 is defocused with respect to the mirror 17 surface. As a result, the sensitizing light is reflected by the reference flat mirror 17 in the form of an expanded light flux. That is, the reflected sensitizing light goes back along a path different from its oncoming path, and, after passing through the reduction projection lens system 8, without being focused on the reticle 7, it reaches the reticle 7 surface in the form of a light flux having an expansion corresponding to the amount of deviation of the reference flat mirror 17 from the focal surface of the reduction projection lens system 8. At this time, a portion of the reflected sensitizing light is eclipsed by the pattern 21 of the reticle 7, such that all the light cannot pass through the light transmitting portion 22. Thus, there occurs a difference in the quantity of reflected light, coming through the reticle, when the mirror 17 does not coincide with the focal surface, as compared with a case when coincidence is established.

The path of the sensitizing light reflected from the reference flat mirror 17, after it passes the reticle 7, as having been described with reference to FIGS. 2 and 3, will now be explained in conjunction with FIG. 1.

The sensitizing light passing the reticle 7 goes through the field lens 6 and reaches the mirror 5. As described hereinbefore, the mirror 6 has a transmission factor of an order of 5–10% with respect to the sensitizing light. Therefore, a portion of the sensitizing light incident on the mirror 5 passes therethrough and then is focused on a field stop 14 by an imaging lens 13. In this example, the surface of the reticle 7 on which the pattern is formed (i.e. the surface of the reticle facing the projection lens system 8) and the field stop 14 are disposed in an optically conjugate relationship with respect to the field lens 6 and the imaging lens 13.

The sensitizing light passing through an aperture of the field stop 14 is directed by a condensing lens 15 to a photoreceptor 16.

If necessary, a filter 51 effective to selectively transmit only the sensitizing light may be disposed in front of the photoreceptor 16, and the photoreceptor 16 can produce an electrical signal corresponding to the quantity of the received sensitizing light.

Figure 4:
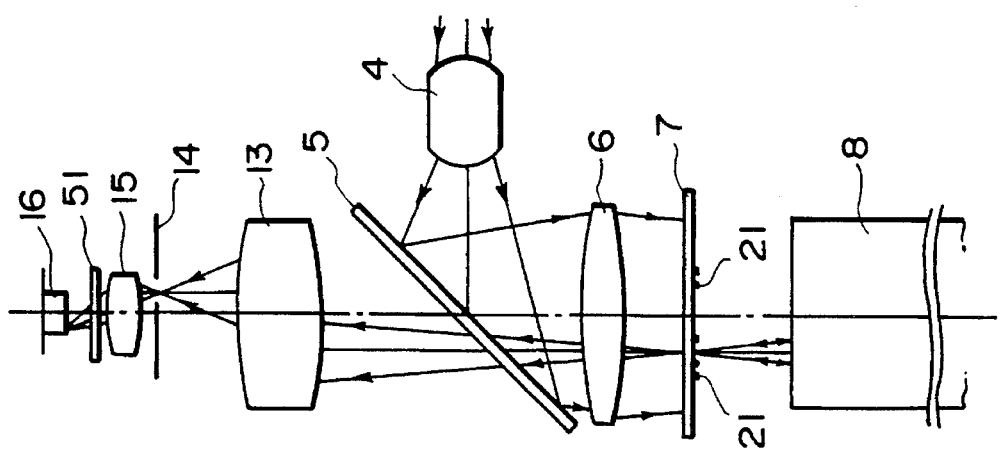
FIG. 4 is a schematic view showing the manner of illuminating a different portion of a reticle, in the first embodiment.

The function of the field stop 14 will now be explained. The field stop 14 can function to restrict the region of the reticle 7 to be detected by the photoreceptor 16. Basically, such a detection region is determined so that it corresponds to an image height with respect to the projection lens system 8 (including a position on its optical axis) of a site that can be detected by the off-axis surface position detecting optical system including the elements 11 and 12. In other words, it is so determined that the surface position detection by the two detecting systems is made to the same region of the reference mirror 17. If, however, a relatively rough pattern such as a scribe line, for example, is included in the detection region and where it has a dominant effect to adversely affect the detection sensitivity, the position of the stop 14 may be shifted to assure that a signal from a fine pattern of the reticle 7 provides a dominant effect. In consideration of this, it is preferable that, as shown in FIG. 4, the position of the field stop 14 in a direction perpendicular to the optical axis and/or all of, or any one of, the size, shape and the like of the aperture of the field stop, may be made adjustable. Although the optical system as a whole, up to the elements 15 and 16, may be made displaceable with the displacement of the field stop 14, their positions will be restricted within a range in which positional correlation with the detection region of the off-axis surface position detecting optical system (11 and 12) is assured. Further, if the light receiving portion of the photoreceptor 16 is small so that the detection region is restricted by the shape of the light receiving portion itself, use of the field stop 14 is not always necessary. On that occasion, the light receiving portion of the photoreceptor 16 may be disposed at a position optically conjugate with the reticle 7, for example, at the position of the field stop 14 as shown in FIG. 1.

Next, description will be made of the manner of detecting the focus position (image surface position) of the reduction projection lens system 8 by using a signal output of this photoreceptor 16.

First, driving means 20 is used to move the X-Y-Z stage 10, to which the reference flat mirror 17 is mounted, in the direction (Z direction) of the optical axis of the reduction projection lens system 8 and about a zero-point position for the position measurement (i.e. a reference position) having been preset by the detection optical system 12. At this time, a relationship such as shown in FIG. 5 is obtainable between (i) the position signal indicative of the position of the reference flat mirror 17 in the direction of the optical axis as measured through the detection optical system 12 (i.e. a measured value Z of the surface position) and (ii) an output of the focal surface detecting system 18 which is obtainable by receiving, at the photoreceptor 16, the sensitizing light reflected by the reference flat mirror 17 and by converting the received light into an electrical signal. In this example, the signal from the detecting system 18 is corrected by using a signal from a reference light quantity detecting system 53, such as by standardizing the signal from the detecting system 18 with use of the signal from the detecting system 53, for example, this being made to preclude the effect of any fluctuation of the light source 1.

As the reference flat mirror 17 is positioned at the focal surface position of the reduction projection optical system 8, the output of the focal surface detecting system 18 shows a peak. A measured value $Z_0$ of the surface position at that time is determined as the focus position of the reduction projection lens system 8 as the same is used for the exposure of the wafer 9. Alternatively, on the basis of the measured value $Z_0$, a preset focus position data may be corrected.

The thus determined focus position of the projection lens system 8 can be used as a reference position for the off-axis surface position detecting system. The best imaging position for the actual wafer printing is at such a distance from this reference position that corresponds to an "offset" of an amount which can be determined while taking into account the thickness of a resist coating on the wafer, the height of a pattern formed in the course of the preceding process and the like. As an example, if the wafer exposure is to be executed by using a multilayered resist process, only the sensitization of the topmost layer of the multilayered structure is sufficient. Accordingly, the resist surface of the wafer will be substantially coincident with the reference position. On the other hand, if a single-layer resist is used so that the sensitizing light sufficiently reaches to a base or substrate, the focus to the wafer will coincide with the substrate surface, not with the resist surface. Therefore, it is not a rare case that an offset of not less than 1 micron is present between the resist surface and the reference position. Such offset is inherent to the process and is defined separately from an offset peculiar to the projection exposure apparatus. On the exposure apparatus side itself, it is sufficient that the focus position of the projection lens system 8 itself can be detected accurately by the method of the present invention as described. Thus, the aforementioned offset may be inputted, as required, to the autofocus control system 19 or the driving system 20 through an unshown system controller of the projection exposure apparatus.

Detection of the focus position $Z_0$ may be determined on the basis of a peak in the output of the focal surface detecting system 18. Also, there may be various other ways. As an example, to improve the sensitivity of detection, a slice level of a certain proportion to the peak output may be set and, by detecting such autofocus measured values $Z_1$ and $Z_2$ as the output has the same height as this slice level, the focus position may be determined as being $Z_0 = (Z_1+Z_2)/2$. As an alternative, the peak position may be determined by using a differentiation method. As a further alternative, it may be determined by detecting a peak in contrast of an image which is formed as a result of re-imaging upon the reticle 7 of the reflection light from the reference mirror 17, through the projection lens system.

In order to enhance the resolution in detection of the focus position $Z_0$, the field stop 14 (in some cases, together with the condensing lens 15 and the photoreceptor 16) may be displaced as shown in FIG. 4, such that the sensitizing light impinging on the photoreceptor 16 corresponds to that having been transmitted through a light transmitting portion 22 of a size close to a critical resolvable linewidth of the reduction projection lens 8.

Figure 6:
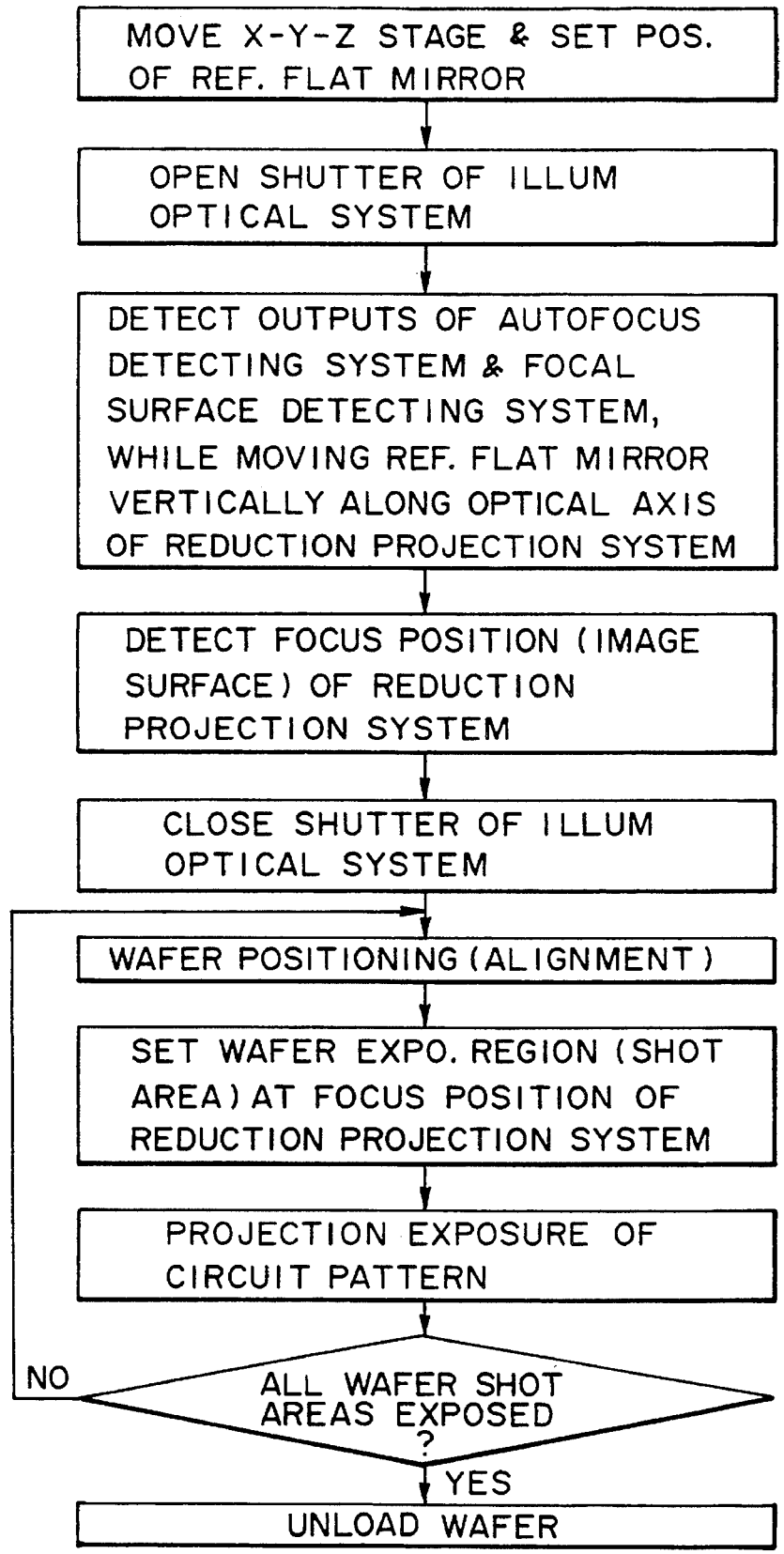
FIG. 6 is a flow chart showing the sequence of an autofocusing operation to be made to a wafer, in the apparatus of the first embodiment.

The procedure from detection of the focus position of the reduction projection lens system 8 to the exposure of the wafer 9 following the focusing operation to the wafer 9, is illustrated in the flow-chart of FIG. 6.

In the flow chart of FIG. 6, for each wafer, the focus position detection of the reduction projection lens system 8 is executed. However, as a matter of course, the focus position detection may be conducted for each shot area of a wafer, for each predetermined number of shot areas or for each predetermined number of wafers.

Thus, by using a reticle to be used for actual pattern transfer, a projection lens system, a sensitizing light, a focus position detecting system and an off-axis surface position detecting system, it is possible to directly measure the focus position of the projection lens system used and to continuously maintain a wafer, on which patterns are to be transferred, exactly in the focal surface of the projection lens system.

Consequently, there is a significant advantage that, in principle, the pattern transfer is not affected by any change in the focus position with time, due to a change in ambient temperature of the projection lens system, a change in atmospheric pressure, a temperature increase in the lens system resulting from irradiation with light or a temperature increase resulting from heat generation within the apparatus as a whole, including the projection lens system.

Additionally, there is an advantage, with respect to the manufacture, that a focus position detecting optical system for the projection lens system can be fabricated only by adding, to a conventional illumination system an imaging optical system, a condensing lens and a photoreceptor, each being simple and inexpensive.

Moreover, the measurement of the focus position according to the present invention can be made at any time in the course of the wafer exposure cycle and, for this reason, there is an advantage that a difference in time between the measurement and the exposure can be made minimum.

FIG. 7 shows another embodiment of the present invention.

Since reticles 7 prepared for different processes for transfer of circuit patterns to a wafer 9 may have different sizes with respect to the exposure region through which the pattern transfer is to be made, in actual projection exposure apparatuses, in many cases, there is provided an illumination range changing mechanism, called a "masking mechanism", such as disclosed in U.S. Pat. No. 4,589,769, for example.

In the second embodiment shown in FIG. 7, the portion other than the illumination optical system has the same structure as the first embodiment described with reference to FIG. 1. Thus, explanation will be made to the illumination optical system.

Hg lamp I which is a light source for exposure has a light emitting portion that is positioned at a first focal point of an elliptical mirror 2. The light emanating from the Hg lamp 1 is concentrated at a second focal point position of the elliptical mirror 2. Optical integrator 3 has a light receiving surface which is disposed at the second focal point position of the elliptical mirror 2. Thus, the light emitting surface of the optical integrator 3 defines a secondary light source. The light emanating from the optical integrator 3 passes a condenser lens 23 and a beam splitter 24 and illuminates a plane in which an illumination range changing mechanism 25 is provided. Denoted at 56 is a shutter; and at 55 is a filter which, like that of the first embodiment shown in FIG. 1, is effective to restrict the range of wavelength to be used for exposure.

In this embodiment, the illumination range changing mechanism 25 comprises a stop member having an aperture of variable shape and functions to pass only a portion of the light illuminating the plane in which the illumination range changing mechanism 25 is present.

The beam splitter 24 has a property for transmitting approximately 90–95% of the exposure light.

The exposure light passing through this illumination range changing mechanism 25 goes through an imaging lens 26 and, after this, its light path is deflected at a right angle by a mirror 27. Then, after passing a field lens 6 it reaches a reticle 7. In this example, the plane in which the aperture of the illumination range changing mechanism 24 is present and a surface of the reticle 7 on which a circuit pattern is formed, are placed in an optically conjugate relationship with each other with respect to the imaging lens 26 and the field lens 6. Further, a reduction projection lens system 8 which is disposed between the reticle 7 and a wafer 9, to be exposed, has an entrance pupil which is disposed in an optically conjugate relationship with the light emitting surface (secondary light source) of the optical integrator 4. Additionally, the circuit pattern surface of the reticle 7 can be illuminated in a Kohler illumination fashion, by means of an illumination optical system including those elements denoted at 1 through 3, 23 through 27 and 6.

The action of the exposure light used for the focus position detection, that is, transmission thereof through a pattern (21, 22) of the reticle 7, passage thereof to the reduction projection lens system 8, the reflection thereof at a reference reflection mirror 17, the second passage thereof through the reduction projection lens system 8 and the transmission thereof through the pattern of the reticle 7, is the same as that having been described with reference to FIGS. 2 and 3.

The exposure light, coming back from the light transmitting portion 22 of the reticle 7 goes through the field lens 6 and, after being reflected by the mirror 27 and transmitted through the imaging lens 26, it passes through the aperture of the illumination range changing mechanism 25. After this, it is reflected by the beam splitter 24 reflecting 5–10% of the exposure light, and then it is directed by a condensing lens 28 to a photoreceptor 16.

The manner of focal surface detection, following this is substantially the same as that having been described with reference to the FIG. 1 embodiment.

One characteristic feature of the FIG. 7 embodiment resides in that the beam splitter 24 is used in place of the mirror 5 of the FIG. 1 embodiment. This arrangement provides an advantage that, with the addition of the illumination range changing mechanism, the apparatus as a whole can be made compact. Further, in this embodiment, the beam splitter 24 also functions for guiding light to a photodetector 50 for monitoring the quantity of the exposure light. Further, the photodetector 50 is also operable as a detector for detecting an integrated light quantity during the circuit pattern projection exposure and, thus, it can be used for control of the exposure amount.

In the embodiments described hereinbefore, the X-Y-Z stage 10 is movable and, by moving the X-Y-Z stage 10 along the optical axis of the reduction projection lens system 8, the measurement of the focus position (i.e. the image surface position) of the projection lens system 8 as well as the positioning of the wafer 9 are executed. However, the projection lens system 8 may be provided with a driving mechanism to make the projection lens system 8 displaceable along its optical axis, to thereby execute the measurement or the positioning.

On that occasion, the projection lens system 8 and the reticle 7 (as well as the reticle stage 70) may be displaced as a unit.

In place of monitoring the quantity of transmission, through the reticle 7, of the reflection light from the reference reflection mirror 17 provided on the X-Y-Z stage 10 to detect the focus position, use may be made of the reference reflection mirror in combination with a different type TTL autofocusing system (for example, one disclosed in U.S. Pat. No. 4,395,117), for detection of the focus position.

While in the foregoing embodiments a portion of the circuit pattern of the reticle 7 is utilized to direct a predetermined light to the reference reflection mirror 17, the reticle 7 may be provided with a separate focus position detecting pattern (e.g. a window) for use in directing the light.

In the foregoing embodiments, a reference reflection mirror (surface) such as at 19, separate from the wafer 9, is provided on the X-Y-Z stage 10 in order to meet a specific process such as a multilayered resist or otherwise. If, however, such a specific reference reflection mirror 19 is not used, a dummy wafer not coated with a resist may be mounted to the X-Y-Z stage 10 in place of using a resist-coated wafer 9, and the focus position of the projection optical system can be detected substantially in the same manner as described hereinbefore.

The projection exposure apparatus of the present invention can be embodied in many ways, other than the examples described in the foregoing. As an example, the present invention is also applicable to an apparatus that uses, as a light source, a laser such as a KrF excimer laser, for example, or to an apparatus having a projection optical system which includes a reflection mirror.

As the means for detecting the position of a wafer surface with respect to the direction of an optical axis of a projection optical system, not only an optical detection process as having been exemplified in the foregoing but also a process using a well-known air-sensor means or an acoustic sensor means, utilizing acoustic waves, may be used.

Figure 8:
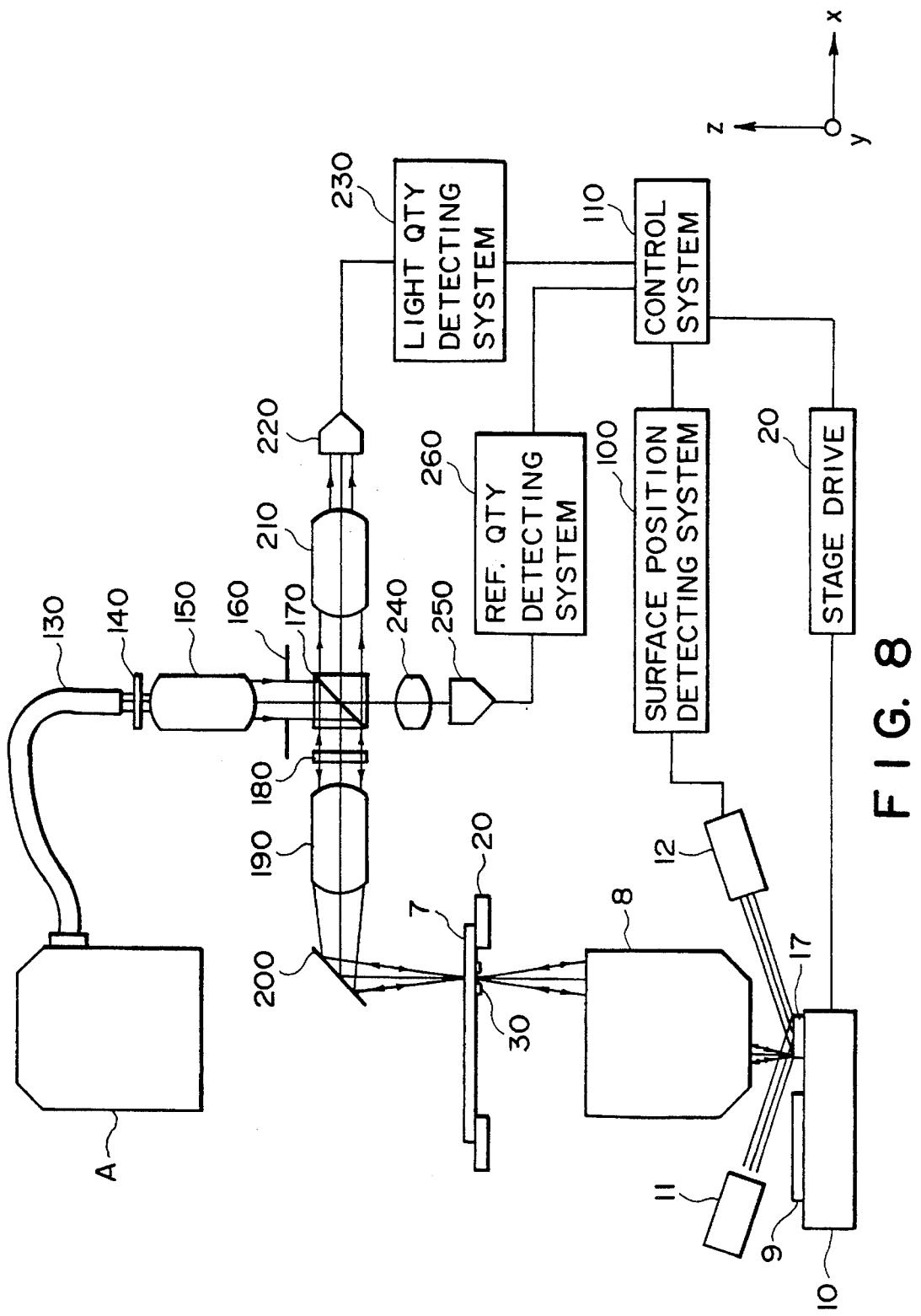
FIG. 8 is a partially schematic and diagrammatic view of a projection exposure apparatus according to a third embodiment of the present invention.

FIG. 8 is a schematic representation showing a major portion of a reduction projection exposure apparatus which includes an automatic focus control system, according to a third embodiment of the present invention.

Denoted in FIG. 8 at 7 is a reticle (photomask) which is held by a reticle stage 20. The reticle 7 has formed thereon a circuit pattern which can be imaged, through a reduction projection lens system 8 and in a reduced scale of ⅕, on a wafer 9 placed on an X-Y-Z stage 10, whereby the exposure of the wafer 9 is conducted. In the FIG. 8 embodiment, at a position adjacent to the wafer 9, there is provided a reference flat mirror 17 having a mirror surface whose height is substantially coincident with that of the upper surface of the wafer 9. The mirror surface of the reference flat mirror 17 is provided by a metal film made of Cr or Al, for example. The reason for using the reference flat mirror 17, in place of an actual wafer coated with a resist material, is such as having been described in the foregoing.

The X-Y-Z stage 4 is movable in a direction (Z direction) of the optical axis of the reduction projection lens system 8 as well as in a plane (X-Y plane) perpendicular to that direction. Of course, it may be made rotatable about the optical axis.

For transfer of the circuit pattern of the reticle to the wafer 9, the picture region of the reticle 1 in which the circuit pattern is formed is illuminated by means of an illumination optical system 7.

Numerals 11 and 12 in FIG. 8 denote constituent elements of an off-axis surface position detecting optical system. Denoted at 11 is a light projecting optical system for projecting a plurality of light beams (fluxes). Each light beam projected by the light projecting optical system 11 comprises a non-printing light with respect to which the photoresist on the wafer 9 does not have a sensitivity. Each of these light beam is focused on the reference flat mirror 17 (or the upper surface of the wafer 9) and is reflected thereby.

Each light beam reflected by the reference flat mirror 17 enters the detection optical system 12. While not shown in the drawing, the detection optical system 12 includes a plurality of position detecting photoreceptors disposed therewithin to be correlated with the reflected beams, respectively. Each position detecting photoreceptor has a light receiving surface which is placed substantially in an optically conjugate relationship with the reflection point of a corresponding beam upon the reference flat mirror 17, with respect to the imaging optical system. Any positional deviation of the reflection point of each beam upon the reference flat mirror 17, in the direction of the optical axis of the reduction projection lens system 8, can be measured as a positional deviation of an inputted light beam upon a corresponding position detecting photoreceptor in the detection optical system 12.

The positional deviation of the reference flat mirror 17, from a predetermined reference plane, as measured through this detection optical system 12 can be calculated, as a surface position, by a surface position detecting device 100, on the basis of output signals from the position detecting photoreceptors. The signal corresponding to a calculated value is applied to a control system 110 by way of a signal line.

In response, the control system 110 supplies an instruction signal to a stage driving means 20 by way of a signal line, so as to move the X-Y-Z stage 10 to which the reference flat mirror 17 is mounted. On the other hand, when the focus position of the projection lens system 8 is to be detected through a TTL process, the control system 110 produces and applies an instruction to the stage driving means 20 to move the X-Y-Z stage 10 so that the reference flat mirror 17 is displaced upwardly or downwardly in the direction (Z direction) of the optical axis of the projection lens system 8 and about a predetermined reference position. Also, in this embodiment, the position of the wafer 9 within the X-Y-plane is controlled at the time of exposure, under the influence of the control system 110 and the stage driving means 20.

Next, description will be made of a focus position detecting optical system for the reduction projection lens system 8, arranged in accordance with the present invention.

Referring to FIGS. 9A and 9B, denoted at 7 is a reticle and at 31—31 are pattern portions formed on the reticle 7 and having a light blocking property. Denoted at 32 is a light transmitting portion sandwiched between the pattern portions 31. The pattern portions 31 and the light transmitting portion 32, in this embodiment, provide a focus position detecting mark. For detection of the focus position (image surface position) of the reduction projection lens system 8, as described, the X-Y-Z stage 10 is displaced along the optical axis of the reduction projection lens system 8. At this time, the reference flat mirror 17 is positioned just underneath the reduction projection lens system 8, and the pattern portions 31 and the light transmitting portion 32 of the reticle 7 are illuminated by means of a focus detecting illumination optical system which will be described later.

Initially, explanation will be made in conjunction with FIG. 9A of a case wherein the mirror surface of the reference flat mirror 17 is exactly at the focus surface position of the reduction projection lens system 8. Light passing through the light transmitting portion 32 of the reticle 7 is focused through the reduction projection lens system 8 upon the reference flat mirror 17 to form, on the mirror surface, an image of the mark of the reticle, and it is reflected thereby. The reflected light goes back along its oncoming path and, through the reduction projection lens system 8, it is focused on the reticle 7 and passes through the light transmitting portion 32 between the pattern portions 31 of the reticle 7. At this time, light is not eclipsed by the pattern portions 31 of the reticle 7, and all the light can pass through the light transmitting portion 32 between the pattern portions 31.

Next, explanation will be made in conjunction with FIG. 9B of an occasion wherein the mirror surface of the reference flat mirror 17 is at a position shifted downwardly from the focal surface of the reduction projection lens system 8. Light passing through the light transmitting portion 32 between the pattern portions 31 of the reticle 7 goes through the reduction projection lens system 8 and reaches the reference flat mirror 17. Since the mirror surface of the reference flat mirror 17 is not at the focal surface position of the reduction projection lens system 8, but is at a position below the focal surface, the image of the mark is defocused with respect to the mirror surface such that the light is reflected by the reference flat mirror 17 in the form of an expanded light flux. Namely, the reflected light goes back along a path different from its oncoming path, then passes through the reduction projection lens system 8 and, without being focused upon the reticle 7, it reaches the reticle 7 in the form of a light flux having an extension corresponding to the positional deviation of the reference flat mirror 17 with respect to the focal surface of the reduction projection lens system 8. At this time, a portion of the reflected light is eclipsed by the pattern portions 31 of the reticle 7, and all the light cannot pass through the light transmitting portion 32. Thus, there occurs a difference in quantity of the reflected light, passing through the reticle 7, as the reference mirror surface does not coincide with the focal surface, as compared with a case wherein the coincidence is obtained.

Referring back to FIG. 8, description will be made of an illumination system and a light receiving system of the focus position detection optical system. The illumination system uses light which is picked up out of the exposure illumination system A by a light guiding fiber means 130 and, thus, which has the same wavelength as that of the exposure light. The illumination system A has the same structure as that shown in FIG. 1. Light emanating from an end of the fiber means 130 is intermittently applied, as a pulsed light, to a relay lens 150 by a chopper (shutter) 140. Then, it passes a stop 160 and enters a polarization beam splitter 170 wherein an S-polarization component of light is reflected toward a quarter waveplate 180, from which it goes to an objective lens 190 and a turning mirror 200, and finally, it illuminates a portion of the reticle 7 close to the focus position detecting mark 30. The stop 160 is at a position of a pupil of the illumination system and functions to determine the shape and size of an effective light source of this illumination system. Also, the position of the stop 160 is in an optically conjugate relationship with a pupil of the projection lens system 8.

The light receiving system will now be explained. As described with reference to FIGS. 9A and 9B, the reflected light coming back from the reference flat mirror 17 through the reticle 7 passes along the turning mirror 200 and the objective lens 190, and impinges on the quarter waveplate 180. By passage through this quarter waveplate 180, the reflected light is transformed into a P-polarization light so that it passes through the polarization beam splitter 170. Then, it passes through a relay lens 210 and enters a photoreceptor 220 which is provided at a position optically conjugate with the pupil of the projection lens system 8, whereby the quantity of light can be detected on the basis of a signal produced by the photoreceptor 220. In this example, the polarization beam splitter 170 and the quarter waveplate 180 can function to ensure an enhanced efficiency of light utilization.

If, at this time, the photoreceptor 220 receives a direct reflection light (not a signal light) from the reticle 7, in addition to the reflection light from the reference flat mirror 17, the reflected light from the reticle 7 acts as a flare to reduce the signal-to-noise ratio of the received signal. If the projection lens system 8 of this embodiment is telecentric only on the wafer side, but not telecentric on the reticle side, since the angle of incidence of the illumination light upon the reticle 7 is not set at a right angle, such a direct reflection light from the reticle 7 does not come back to the light receiving system and, consequently, it is not received by the photoreceptor 220. If, on the other hand, the projection lens system 8 is telecentric both on the reticle side and on the wafer side, the quarter waveplate 180 may be removed from the illustrated position and may be disposed between the reticle 7 and the X-Y-Z stage 10 (for example, within the projection lens system 8). By doing so, the direct reflection light from the reticle 7 can be blocked (reflected) at the polarization beam splitter 170, such that it can be prevented from impinging on the photoreceptor 220. Thus, through the projection lens 8, only the reflected light from the reference flat mirror 17 can be directed to and received by the photoreceptor 22, whereby the signal-to-noise ratio can be enhanced.

Numerals 240 and 250 in FIG. 8 denote constituent elements of a light quantity monitor of the focus position detecting optical system, wherein numeral 240 indicates a condensing lens and numeral 250 indicates a photoreceptor.

As described hereinbefore, the S-polarization light component of the light emanating from the light guiding fiber means 130, is reflected by the polarization beam splitter 17 and illuminates the focus position detecting mark 30. The remaining P-polarization light component passes through the polarization beam splitter 17. The thus transmitted light is concentrated on the photoreceptor 250 by the condensing lens 240. The photoreceptor 250 produces and applies a signal corresponding to the intensity of the received light, to a reference light quantity detecting system 260 along a signal line.

Accordingly, if the light from the fiber means 130 has a random polarization characteristic, then the signal from the photoreceptor 250 is changeable in proportion to the variation in the quantity of light from the fiber means 130.

Next, description will be made of a method of detecting the focus position (image surface position) of the reduction projection lens system 100, by using a signal output from the photoreceptor 220.

The stage driving means 20 is operable to move the X-Y-Z stage 10, on which the reference flat mirror 17 is mounted, in a direction of the optical axis of the reduction projection lens system 8 and about a zero-point which is preset by the off-axis type surface position detecting optical system 12. As the stage 10 moves, the positions of the reference flat mirror 17 which are different with respect to the direction of the optical axis are monitored by the surface position detecting device 100, on the basis of signals from the position detecting optical system 12. Of these measured positions, such a measured value which is close to the position whereat an image of the focus detecting mark 30 is projected by the focus position detecting system is used as a representative Z, representing the position of the reference flat mirror 17. The relationship obtainable between this representative Z and a signal output to be produced by the light quantity detecting system 230, as the light reflected by the reference flat mirror 17 is received by the photoreceptor 220, is substantially the same as that illustrated in FIG. 5.

In this embodiment, in order to avoid the effect of fluctuation (variation in light quantity) of a light source such as an Hg lamp of the exposure illumination system A, the signal from the light quantity detecting system 230 is standardized by using a signal from the reference light quantity detecting system 260, as described. The standardization is made in the control system 110. Further, for reducing the effect of shot noise of the photoreceptor 220, the light from the fiber means 130 is blocked at predetermined intervals by means of the chopper 140 to allow the mark 30 to be illuminated intermittently, and with the detection system 230, the signals are detected in a timed-relationship with the intermittent illumination. To assure this operation, the chopper 140 communicated with the control system 110 by means of an unshown signal line, such that the control system 110 can function to execute synchronous control of the chopper 140 and the detection system 230. To this end, the control system 110 includes a timing circuit from which drive clocks of a predetermined frequency are applied to an actuator (not shown) of the chopper 140 and the detection system 230.

As the reference flat mirror 17 is positioned at the focal surface (image surface) of the reduction projection lens system 8, the output signal of the detection system 230 shows a peak. A measured value $Z_0$ provided at this moment by the surface position detecting device 100 is determined as the focus position of the reduction projection lens system 8 upon exposure of the wafer 9.

The thus determined focus position of the projection lens system 8 can be used as a reference position for the off-axis surface position detecting system 12 and the device 100. The best-imaging position for the actual wafer printing is, as described hereinbefore, at such a distance from this reference position that corresponds to an "offset" of an amount which can be determined while taking into account the thickness of a resist coating on the wafer, the height of a pattern formed in the course of the preceding process and the like. As an example, if the wafer exposure is to be executed by using a multilayered resist process, only the sensitization of the topmost layer of the multilayered structure is sufficient. Accordingly, the resist surface of the wafer will be substantially coincident with the reference position. On the other hand, if a single-layer resist is used so that the sensitizing light sufficiently reaches to a base or substrate, the focus to the wafer will coincide with the substrate surface, not with the resist surface. Therefore, it is not a rare case that an offset of not less than 1 micron is present between the resist surface and the reference position. Such offset is inherent to the process and is defined separately from an offset peculiar to the projection exposure apparatus. On the exposure apparatus side itself, it is sufficient that the focus position of the projection lens system 8 itself can be detected accurately by the method of the present invention as described. Thus, the aforementioned offset may be inputted, as required, to the control system 110 or the driving system 20 through an unshown system controller of the projection exposure apparatus.

Detection of the focus position $Z_0$ may be determined on the basis of a peak in the output of the detecting system 230. Also, there may be various other ways. As an example, to improve the sensitivity of detection, a slice level of a certain proportion to the peak output may be set and, by detecting such autofocus measured values $Z_1$ and $Z_2$ as the output has the same height as this slice level, the focus position may be determined as being $Z_0 = (Z_1+Z_2)/2$. As an alternative, the peak position may be determined by using a differentiation method. As a further alternative, it may be determined by detecting a peak in contrast of an image of the mark 30 which is formed as a result of re-imaging upon the reticle 7 of the reflection light from the reference mirror 17, through the projection lens system 8.

Regarding the mark 30 provided on the reticle 7, the smaller the linewidth of the light transmitting portion 32 (pattern), the larger the change in the output signal from the photoreceptor 220 (with the change in the reference flat mirror 17 position in the direction of the optical axis) and, thus, the better is the sensitivity of detection of the image surface position. In consideration of this, in the present embodiment, the linewidth l of the mark 30 is set so as to satisfy that $l=0.8(\lambda/NA\cdot\beta)$, to thereby ensure enhanced sensitivity of detection of the image surface position, wherein $\lambda$ is the wavelength of the light illuminating the mark 30, NA is the numerical aperture of the projection lens system on the wafer side and $\beta$ is the magnification of the projection lens system.

From experiments, it has been found that in order to ensure good detection of the focus position (image surface position) the linewidth l of the mark 30 should satisfy the following condition:

$$0.6(\lambda/NA\cdot\beta) \leq l \leq 1.0(\lambda/NA\cdot\beta) \quad (1)$$

Additionally, to ensure detection of the image surface position with higher precision, preferably the linewidth l should be determined to satisfy the following relation:

$$0.6(\lambda/NA\cdot\beta) \leq l \leq 0.8(\lambda/NA\cdot\beta) \quad (2)$$

Figure 10B:
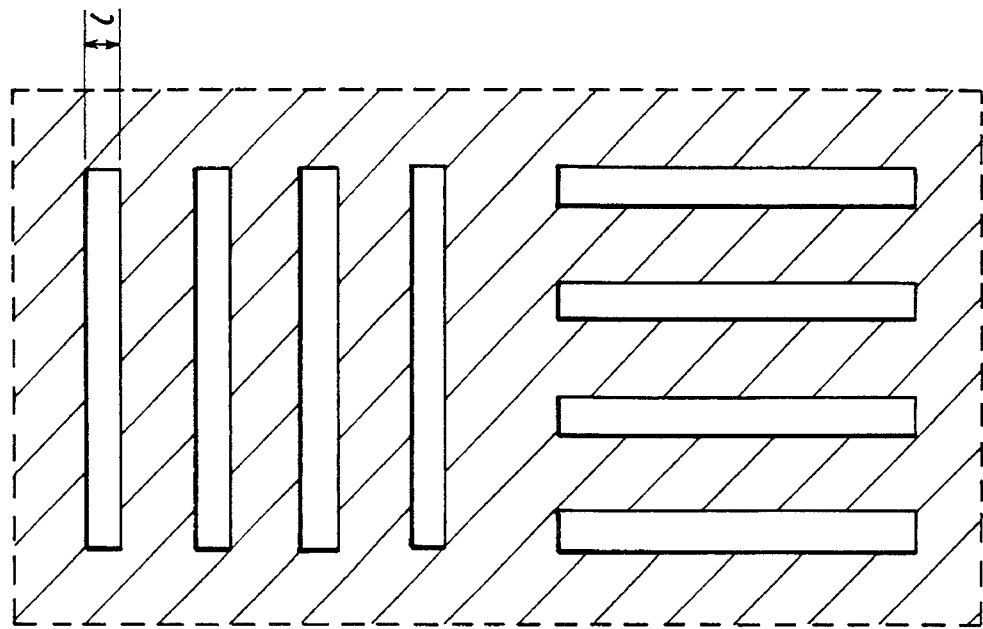
FIGS. 10A and 10B are plan views, respectively, each showing a focus position detecting mark means usable in the third embodiment.
Figure 10A:
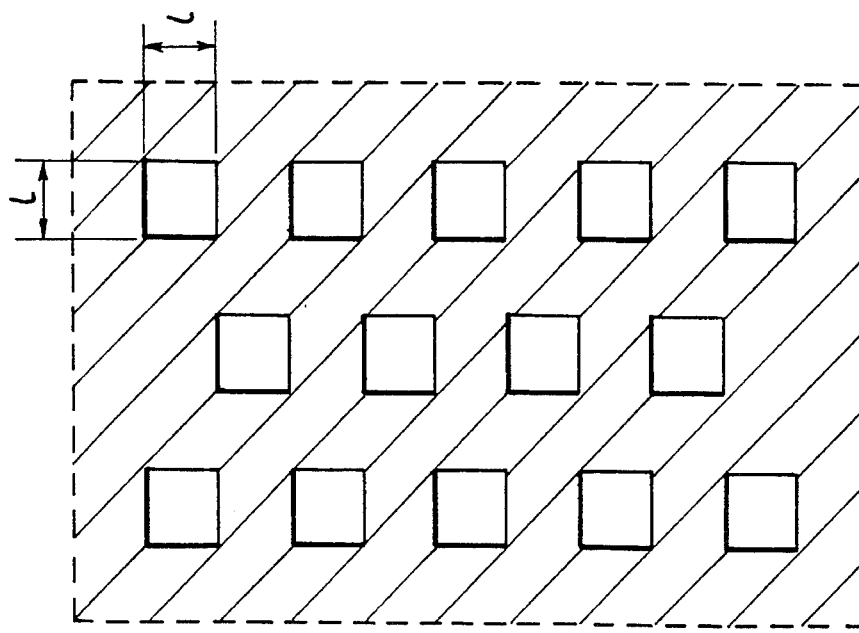

With reduction in linewidth of the light transmitting portion 32 of the mark 30, the intensity of light incident on the photoreceptor decreases with a resultant tendency to inferior signal-to-noise ratio. In order to compensate such tendency, in this embodiment, a focus position detecting mark such as shown in FIG. 10A or 10B is used. As shown in FIG. 10A or 10B, the mark is provided by a number of arrayed slits each having a linewidth l. This arrangement can enhance the intensity of light to be inputted to the photoreceptor.

Figure 11A:
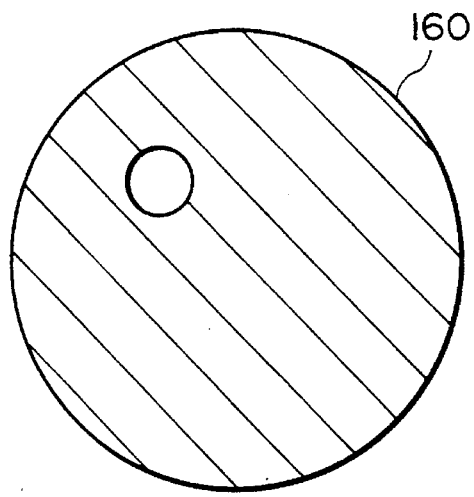
FIGS. 11A–11C are plan views, respectively, each showing a focus position detecting field stop usable in the third embodiment.

Further, in this embodiment, for enhanced sensitivity of detection of the image surface position, a specific arrangement is adopted in the illumination system for illuminating the focus position detecting mark 30 of the reticle 7. FIG. 11A is a plan view showing the shape of a stop 160 used in this embodiment. The stop 160 can function to determine the shape of an effective light source for illumination of the reticle 7, and in FIG. 11A the region depicted by hatching is a light blocking portion while a blank region depicts a light transmitting portion.

As shown in FIG. 11A, the stop 160 of this example has a light transmitting portion, defining an effective light source, which is eccentric with respect to an optical axis (an optical axis of the illumination system). As a result, any change in the position of the reference flat mirror 17 in the direction of the optical axis (the direction of the optical axis of the projection lens system) will cause a blurring of the image of the mark as a well as shift of the image in a plane perpendicular to the optical axis. Consequently, the change in the output signal from the photoreceptor 220 becomes large, thus resulting in enhanced sensitivity of detection of the image surface position.

Figure 11B:
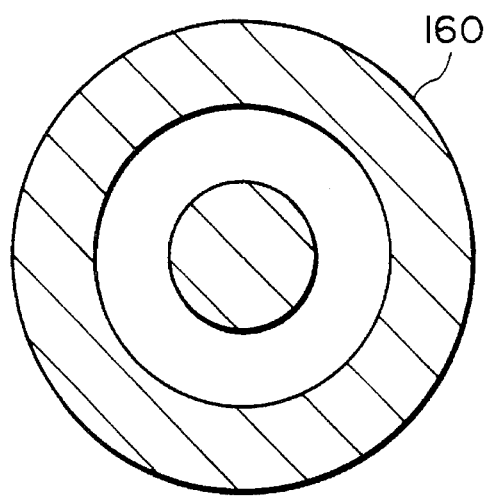
Figure 11C:
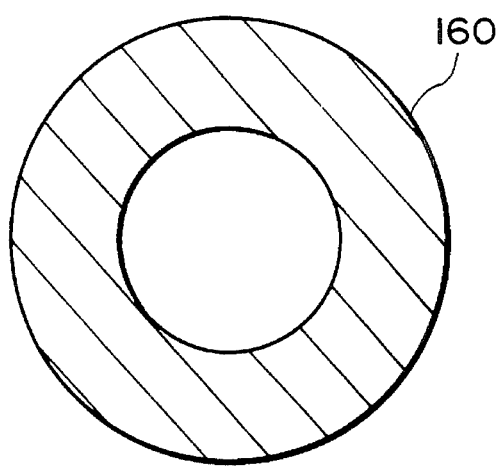

FIGS. 11B and 11C are plan views, respectively, each showing another example of a stop usable in the projection exposure apparatus of the present embodiment. The FIG. 11B example has a light transmitting portion of a ring-like shape, and the intensity of light to be inputted to the photoreceptor 220 can be increased as compared with the FIG. 11A example. Also, the precision and sensitivity of detection can be improved.

On the other hand, FIG. 11C shows an example of a stop wherein its light transmitting portion is not eccentric with respect to the optical axis. Thus, the effective light source for illumination of the focus position detecting mark 30 can be substantially the same as the effective light source for exposure. With such a stop, the defocus characteristic of the projection lens system 8 at the time of actual exposure can be reproduced and, therefore, it is possible that the image surface detected by the image surface detecting system and the image surface at the time of exposure are brought into strict coincidence with each other.

Figure 12:
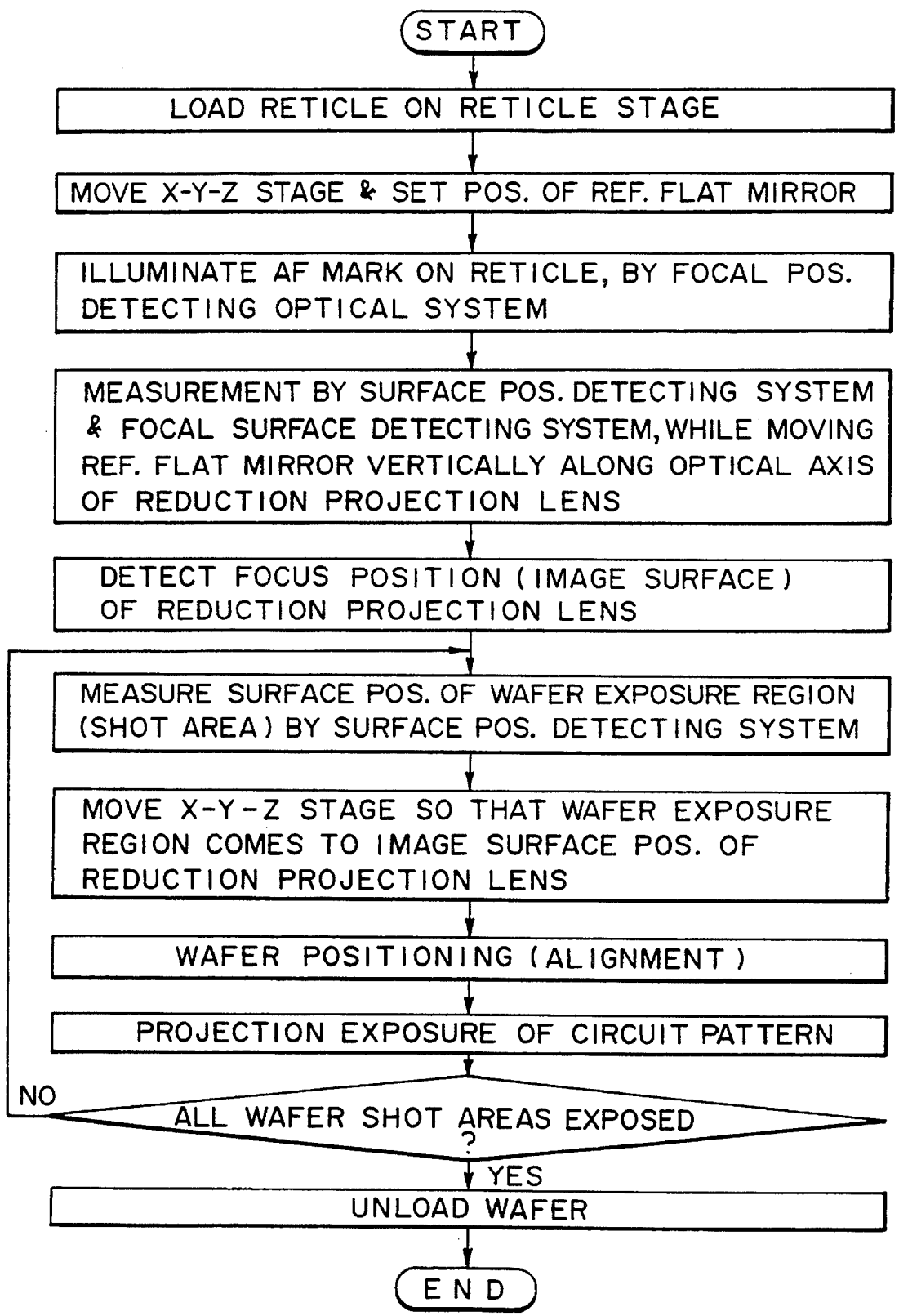
FIG. 12 is a flow chart showing the sequence of an autofocusing operation to be made to a wafer, in the apparatus of the third embodiment.

The procedure from detection of the image surface position of the reduction projection lens system 8 to the exposure of the wafer 9 following the focusing operation to the wafer 9, is illustrated in the flow chart of FIG. 12.

In the flow chart of FIG. 12, for each wafer, the focus position detection of the reduction projection lens system 8 is executed. However, as a matter of course, the focus position detection may be conducted for each shot area of a wafer, for each predetermined number of shot areas or for each predetermined number of wafers.

Thus, by using a reticle to be used for actual pattern transfer and a light (detection light) passing a projection lens system, it is possible to directly measure a focus position of the lens system. Further, by using an off-axis surface position detecting system, it is possible to separately measure the surface position of a wafer, on which patterns are to be transferred. Thus, by correlating them, it is possible to position the wafer surface, exactly in the focal surface of the projection lens system.

Consequently, there is a significant advantage that in principle, the pattern transfer is not affected by any change in the focus position with time, due to a change in ambient temperature of the projection lens system, a change in atmospheric pressure, a temperature increase in the lens system resulting from irradiation with light or a temperature increase resulting from heat generation within the apparatus as a whole, including the projection lens system.

Moreover, the measurement of the focus position according to the present invention can be made at any time in the course of the wafer exposure cycle and, for this reason, there is an advantage that a difference in time between the measurement and the exposure can be made minimum.

In the present embodiment, the focus position detecting optical system and the focus position detecting mark are placed in a fixed positional relationship. If the focus position detecting mark can be set at any time at a constant site upon a reticle, the detection using the focus position detecting optical system may be conducted at a fixed position. However, there may be some cases wherein an exposable range is restricted by the presence of the mark. If, therefore, an exclusive mark is to be provided for the focus position detection, it is desirable that such a mark can be set at any desired site in accordance with the size of a circuit pattern to be printed. To this end, preferably at least the detecting unit including the objective lens 19 and the mirror 20 may be made movable along the surface of the reticle 7 so that the positions of these elements are changeable relative to the reticle, in accordance with the variation in position of the focus position detecting mark on the reticle 7.

Figure 13:
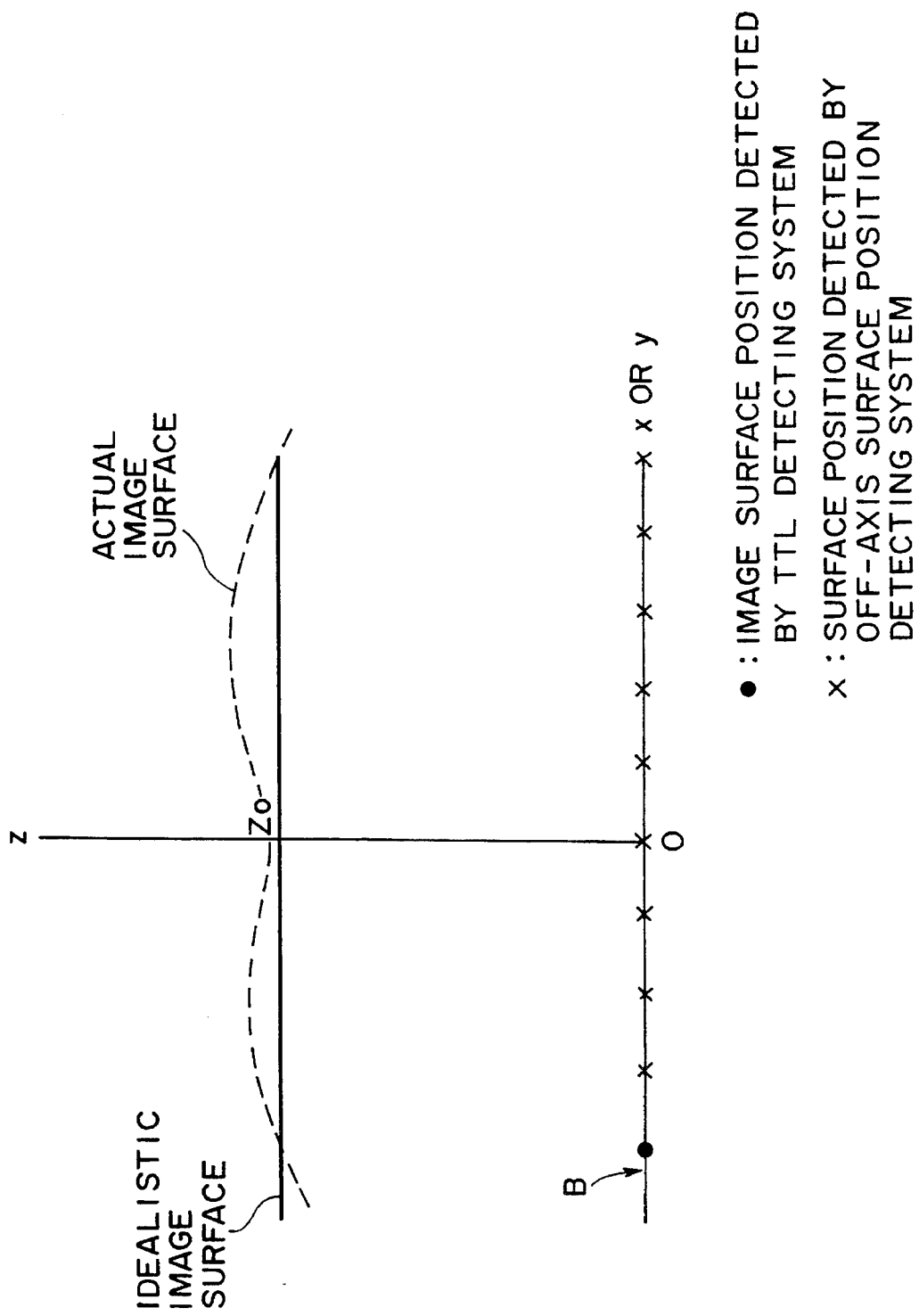
FIG. 13 is a graph illustrating an idealistic image surface and an actual image surface defined by a projection lens system.

FIG. 13 is a graph illustrating a difference between an idealistic image surface and an image surface actually defined by a projection lens system 8. While a projection lens system 8 is usually strictly aberration-corrected for accurate projection of a circuit pattern of a reticle 7 upon a wafer 9, it is not possible to completely correct the curvature of field, for example. When the projection lens system 8 has a large depth of focus or when the required resolvable linewidth is large, the curvature of field of a certain degree can be disregarded. If, however, the numeral aperture of the projection lens system is made large for enhanced resolution or when the view angle is made large, the presence of the curvature of field cannot be disregarded.

In consideration of this, when the surface of a wafer 9 is to be positioned at the image surface position of a projection lens system 8, it will be necessary to take into account data related to the curvature of field of the projection lens system 8.

As an example, in the embodiment described above, the focus position detecting mark 30 is provided out of the axis of the projection lens system 8, and the focus position detecting optical system functions to detect the image surface position only with respect to a certain single point (B) thereof which is outside the axis of the projection lens system 8. If, on that occasion, the actual image surface is curved such as depicted by a broken line in FIG. 13, the true image surface position at a different site in the image surface is not detected.

Accordingly, it is desirable to detect, from a measured image surface position at a particular point B and on the basis of a field curvature data of the projection lens system 8 having been prepared by inspection in advance the image surface position at each different site. The field curvature data may be stored into memory within the control system 11 shown in FIG. 8.

In the projection exposure apparatus of the FIG. 8 embodiment, the surface position at each of different sites on the wafer 9 (the region to be exposed or shot areas thereof) can be detected just before the exposure by using the surface position detecting device 100. Based on data related to the obtained surface positions at the different sites, the position of the wafer 5 with respect to the direction of the optical axis as well as any inclination of the wafer can be corrected. On this occasion, by moving the X-Y-Z stage 10 so as to introduce, between the adjusted surface position Z of the wafer 9 and the actual image surface positions $Z_{0i}$ (i=1, 2, 3, ..., and m) of the projection lens system 8 corresponding to these different sites, the following relationship:

$$\sum_{i=1}^{m} (Z - Z_{0i})^2 \simeq \min. \tag{3}$$

then, the wafer 9 surface can be positioned at a best image surface position of the projection lens system 8.

This leads to the result that the best image surface position of the projection lens system 8 is determined on the basis of the field curvature data and the focus position (image surface position) obtained through the surface position detecting device 100 and the detecting systems 230 and 260, and that the surface position adjustment to the wafer is carried out while aiming at this best image surface position. In this example, the best image surface (reference image surface) is determined from actual positions of different image points on the image surface and by using a least square method.

Figure 14:
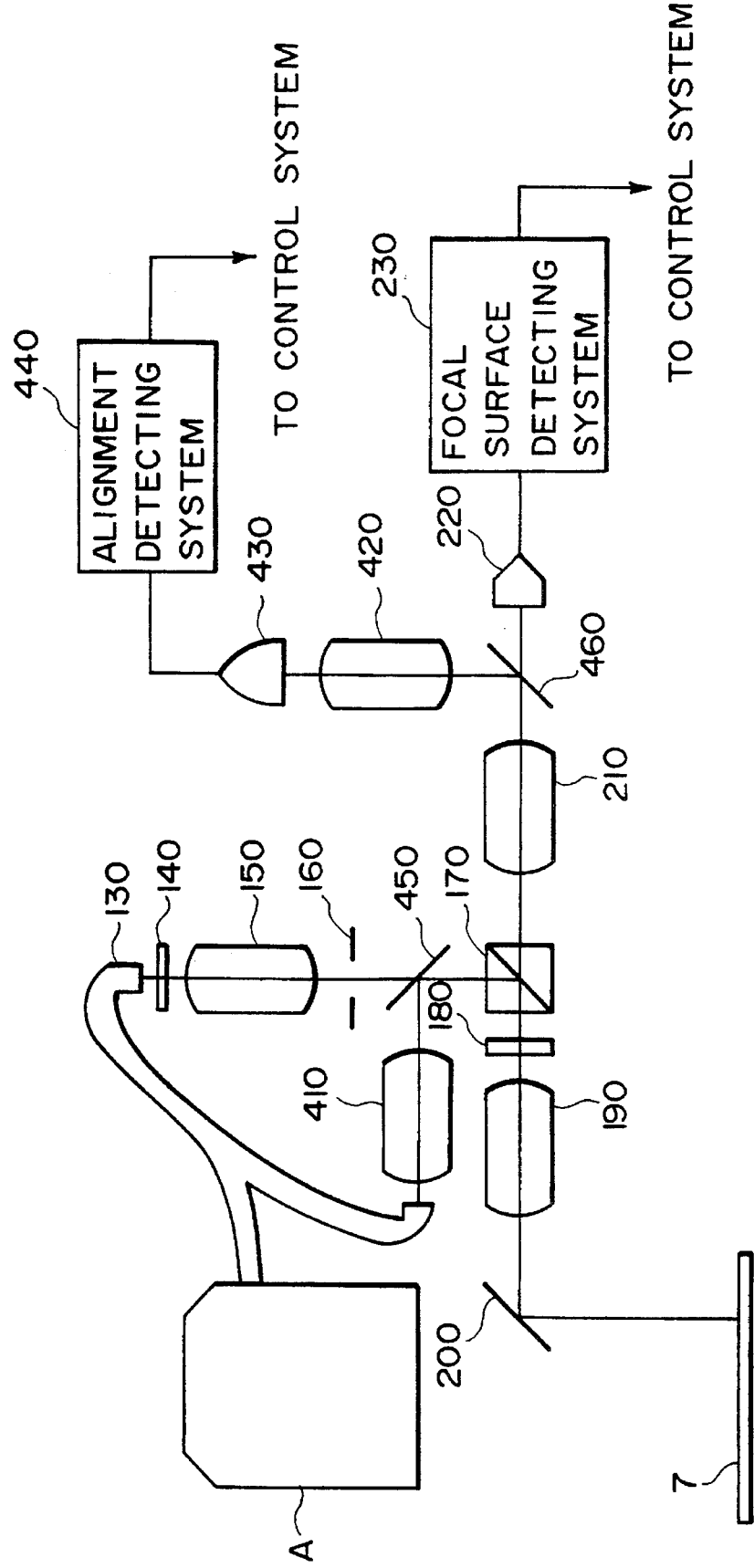
FIG. 14 is a partially schematic and diagrammatic view of a projection exposure apparatus according to a fourth embodiment of the present invention.

FIG. 14 is a fragmentary and schematic representation showing another embodiment of a focus position detecting optical system. The portion of this embodiment not illustrated in the drawings has the same structure as that of the corresponding portion of the FIG. 8 embodiment.

In this embodiment, the illustrated TTL focus position detecting optical system is not incorporated into a projection exposure apparatus as an independent unit, but it is provided so that its optical arrangement can be used in common as a part of an alignment mark detecting optical system, provided for alignment of a reticle 7 and a wafer 9, whereby the structure of the apparatus can be made compact. Particularly, turning mirrors denoted at 450 and 460 in FIG. 14 are arranged to be selectively inserted into or retracted from the light path at the time of focus position detection and at the time of alignment mark detection. One characteristic feature of the present invention as compared with the FIG. 8 apparatus is that: a retractably insertable mirror 450 is disposed between a stop 160 and a polarization beam splitter 170; exposure light is picked up from an exposure illumination system A by using light guiding forked fiber means 130, the guided light being coupled with an illumination system of the TTL focus position detecting optical system by using a relay lens 410 and the half mirror 450, whereby an alignment mark of the reticle 7 can be illuminated. While not shown in the drawing, a viewfield restricting slit is provided at a position optically conjugate with a mark bearing surface of the reticle 7 and, by using this slit, only the portion of the reticle close to the alignment mark is illuminated. The light illuminating the alignment mark of the reticle 1 goes through the projection lens system 8 and also illuminates an alignment mark provided on the wafer 9. In response, light from the reticle alignment mark and the wafer alignment mark comes back by way of a mirror 200 and an objective lens 190 and enters a quarter waveplate 180. Thereafter, the light goes through the polarization beam splitter 170 and a relay lens 210 and, then, as compared with the system shown in FIG. 8 it is reflected by the retractable mirror 460, such that by way of a relay lens 420, it is imaged upon a CCD 430. Then, by detecting any deviation between an image of the wafer alignment mark and an image of the reticle alignment mark, as formed on the CCD 430, by using an alignment detecting system 440, the reticle-to-wafer alignment can be made. By retracting the mirrors 450 and 460 from their illustrated positions on the light path, it is possible to conduct the focus position detection as described hereinbefore.

When the viewfield of the optical system is divided and used by the TTL focus position detecting optical system and the alignment mark detecting optical system, the photoreceptor may be used in common. Also, the reticle alignment mark may be used as a focus detecting mark.

In the embodiment described above, the off-axis surface position detecting optical system 12 functions to detect the positions, at different sites in the direction of the optical axis, of the reference flat mirror 17 and the wafer 9 surface. However, the system may be used to detect the position of each surface at a particular single point as well as any inclination of that surface. Further, if the surface inclination is small or, alternatively, the off-axis surface position detecting optical system is used to detect the surface position at the same site as the detection point by the TTL focus position detecting optical system, it may be used to detect the surface position only at a single point. In other words, it is sufficient that the off-axis surface position detecting optical system can measure the position of such portion of the mirror surface, with respect to the direction of the optical axis, which is close to the detection point by the TTL focus position detecting optical system. Therefore, the measurements by these detecting optical systems may be made at the same time or, alternatively, made in sequence as illustrated in FIG. 15. Depicted in FIG. 15 is a flow chart, related to the focus position detection wherein the off-axis surface position detecting optical system operates to detect only the position at a single point of the reference flat mirror.

In the present embodiment, as described hereinbefore, a wafer coated with a resist is not used, but a predetermined reference reflection surface is provided on a wafer stage and, by using such reflection surface and a TTL focus position detecting system, the focus position (image surface position) of a projection optical system is detected. By using the detected position as a reference, adjustment is made for positioning the wafer surface at the image surface position. As a result, the focus position of the projection optical system which is variable with time can be detected with high precision and, for this reason, high-precision focusing is attainable. This provides a significant advantage that high-resolution patterns can be formed on a wafer and, thus, microcircuit devices of a higher degree of integration can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

illumination means for defining a shape of an effective light source to illuminate a circuit pattern of a mask with an exposure beam;

a projection optical system for projecting an image of the circuit pattern of the mask illuminated with the exposure beam; and detecting means for detecting an image plane of said projection optical system, said detecting means comprising a detection optical system for defining a shape of an effective light source, substantially the same as that defined by said illumination means, to illuminate a mark of the mask with a detection beam, and said detecting means detecting the image plane on the basis of an image of the mark projected by said projection optical system in response to illumination of the mark with the detection beam.

2. An apparatus according to claim 1, wherein said projection optical system comprises a lens.

3. An apparatus according to claim 2, wherein the detection beam has a wavelength substantially the same as that of the exposure beam.

4. An apparatus according to claim 3, wherein said illumination means and said detection optical system each comprise aperture stops having apertures of substantially the same configuration for respectively defining the shape of the effective light sources.

5. An apparatus according to claim 3, wherein said detecting means comprises a photoreceptor disposed to receive any light forming the image of the mark which is reflected by a reflection surface provided adjacent to the image plane and approaches said photoreceptor via said projection optical system and the mark, and wherein said photoreceptor transforms the received light into a signal corresponding to a deviation of the reflection surface from the image plane.

6. In a device manufacturing method, which includes a step of detecting through a detection optical system an imaging plane on which a device pattern is to be imaged by a projection optical system, a step of positioning a workpiece upon the detected imaging plane and a step of illuminating the device pattern with a beam from an illumination optical system such that an image of the device pattern is projected on the workpiece through the projection optical system, the improvement comprising the steps of:

supplying to the detection optical system a shape of an effective light source, which is substantially the same as a shape of an effective light source of the illumination optical system; and illuminating, for the detection of the imaging plane, a mark with a beam from the detection optical system such that an image of the mark is projected through the projection optical system.

7. In a device manufacturing method, which includes a step of detecting through a detection optical system an imaging plane on which a device pattern is to be imaged by a projection optical system comprising a lens system, a step of positioning a workpiece upon the detected imaging plane and a step of illuminating the device pattern with an exposure beam from an illumination optical system such that an image of the device pattern is projected on the workpiece through the projection optical system, the improvement comprising the steps of:

supplying to the detection optical system a shape of an effective light source, which is substantially the same as a shape of an effective light source of the illumination optical system; and illuminating, for the detection of the imaging plane, a mark with a detection beam from the detection optical system having substantially the same wavelength as that of the exposure beam, such that an image of the mark is projected through the projection optical system.

8. A projection exposure apparatus comprising:

an illumination optical system for illuminating a pattern of a mask with an exposure beam;

a projection optical system for imaging, on a workpiece, the pattern of the mask illuminated with the exposure beam; and detecting means for detecting an imaging plane of said projection optical system, said detecting means comprising (i) a detection optical system having a shape of an effective light source substantially the same as a shape of an effective light source of said illumination optical system, and (ii) means for illuminating, with a detection beam, an imaging plane detecting mark to project an image thereof through said projection optical system.

9. A projection exposure apparatus comprising:

an illumination optical system for illuminating a pattern of a mask with an exposure beam;

a projection optical system having a lens system, for imaging the pattern of the mask illuminated with the exposure beam on a workpiece; and detecting means for detecting an imaging plane of said projection optical system, said detecting means comprising (i) a detection optical system having a shape of an effective light source substantially the same as a shape of an effective light source of said illumination optical system, and (ii) means for illuminating, with a detection beam having substantially the same wavelength as that of the exposure beam, an imaging plane detecting mark to project an image thereof through said projection optical system.

10. A projection exposure apparatus, comprising:

an illumination optical system for illuminating a pattern of a mask with an exposure beam;

a projection optical system for imaging, on a workpiece, the pattern of the mask illuminated with the exposure beam; and detecting means for detecting an imaging plane of said projection optical system, wherein said detecting means comprises a detection optical system having a shape of an effective light source such that a light intensity on an optical axis of said detection optical system is lower than that at a peripheral portion around the optical axis, and said detection optical system illuminates an imaging plane detecting mark with a detection beam, and said detecting means detects the image plane on the basis of an image of the imaging plane detecting mark projected by said projection optical system in response to illumination of the imaging plane detecting mark with the detection beam.

11. An apparatus according to claim 10, wherein the shape of the effective light source of said detection optical system comprises a ring-like shape.

12. An apparatus according to claim 10, wherein the shape of the effective light source of said detection optical system is eccentric with respect to an optical axis of said detection optical system.

13. In a device manufacturing method which includes detecting through a detection optical system an imaging plane on which a device pattern is to be imaged by a projection optical system, positioning a workpiece upon the detected imaging plane and illuminating the device pattern with a beam from an illumination optical system such that an image of the device pattern is projected on the workpiece through the projection optical system, the improvements comprising the steps of:

providing a shape of an effective light source to the detection optical system, wherein the shape of the effective light source is such that a light intensity on an optical axis of said detection optical system is lower than that at a peripheral portion around the optical axis; and illuminating, for detection of the imaging plane, a mark with a beam from the detection optical system such that an image of the mark is projected through the projection optical system.

* * * * *

UNITED STATES PATENT AND TRADEMARK OFFICE
CERTIFICATE OF CORRECTION

PATENT NO. : 5,489,966
DATED : February 6, 1996
INVENTOR(S) : Haruna KAWASHIMA, et al.

It is certified that error appears in the above-indentified patent and that said Letters Patent is hereby corrected as shown below:

COLUMN 13:

Line 33, "beam" should read --beams--.

COLUMN 17:

Line 50, "that" should read --the relation--.

COLUMN 18:

Line 28, "a" (first occurrence) should be deleted, and "as" (second occurrence) should read --as a--.

COLUMN 19:

Line 63, "a" should be deleted;
Line 64, "advance" should read --advance,--.

UNITED STATES PATENT AND TRADEMARK OFFICE
CERTIFICATE OF CORRECTION

PATENT NO. : 5,489,966
DATED : February 6, 1996
INVENTOR(S) : Haruna KAWASHIMA, et al.

It is certified that error appears in the above-indentified patent and that said Letters Patent is hereby corrected as shown below:

<u>COLUMN 22</u>:

Line 11, "claim 3," should read --claim 1,--;
Line 16, "claim 3," should read --claim 1,--.

Signed and Sealed this

Tenth Day of September, 1996

Attest:

BRUCE LEHMAN

Attesting Officer      Commissioner of Patents and Trademarks